(12) United States Patent
Nishida

(10) Patent No.: US 8,689,435 B2
(45) Date of Patent: Apr. 8, 2014

(54) MOUNTING SYSTEM FOR MOUNTING ELECTRONIC COMPONENTS

(75) Inventor: Shinya Nishida, Saitama (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/434,452

(22) Filed: Mar. 29, 2012

(65) Prior Publication Data

US 2012/0272510 A1 Nov. 1, 2012

(30) Foreign Application Priority Data

Apr. 26, 2011 (JP) ................................. 2011-098335

(51) Int. Cl.
*B23P 19/00* (2006.01)

(52) U.S. Cl.
USPC .................................. 29/740; 29/729; 29/742

(58) Field of Classification Search
USPC ........... 29/729, 739–743, 834, 705, 719–722; 382/151, 144
See application file for complete search history.

(56) References Cited

U.S. PATENT DOCUMENTS

| | | | | |
|---|---|---|---|---|
| 5,402,564 A | * | 4/1995 | Tsukasaki et al. | 29/832 |
| 5,564,183 A | * | 10/1996 | Satou et al. | 29/840 |
| 8,224,063 B2 | * | 7/2012 | Kameda et al. | 382/151 |
| 2009/0049682 A1 | * | 2/2009 | Yagi et al. | 29/740 |
| 2009/0293265 A1 | * | 12/2009 | Inoue et al. | 29/739 |
| 2010/0195897 A1 | * | 8/2010 | Kameda et al. | 382/151 |
| 2010/0201805 A1 | * | 8/2010 | Hamada et al. | 348/92 |
| 2010/0220918 A1 | * | 9/2010 | Iwahashi et al. | 382/141 |
| 2012/0272510 A1 | * | 11/2012 | Nishida | 29/592.1 |

FOREIGN PATENT DOCUMENTS

| | | |
|---|---|---|
| JP | 2001-230598 | 8/2001 |
| JP | 2002-134998 | 5/2002 |

* cited by examiner

*Primary Examiner* — Minh Trinh
(74) *Attorney, Agent, or Firm* — K&L Gates LLP

(57) ABSTRACT

A mounting system including: a storage that stores plural formats for each substrate including divisional information of a mounting apparatus indicating which of plural mounting apparatuses that divisionally mount plural electronic components on a substrate mounts what electronic component on the substrate and information on a deviation amount of an electronic component indicating how much each of the electronic components mounted on the substrate and inspected by an inspection apparatus is deviated from its regular position; and a controller that changes, according to a change of an assignment of mounting, the divisional information in a format corresponding to the substrate for which the assignment has been changed, and controls the mounting apparatus that has mounted the electronic component and has been specified from the mounting apparatuses to mount the electronic component on the substrate after correcting a deviation amount based on the information on a deviation amount.

4 Claims, 19 Drawing Sheets

Format of substrate 1a    2(2a)

| Component name | Mounting apparatus number | X coordinate | Y coordinate | θ | Deviation X | Deviation Y | Deviation θ |
|---|---|---|---|---|---|---|---|
| R1 | 1 | 100 | 50 | 0 | 0 | 0 | 0 |
| R2 | 1 | 100 | 60 | 90 | 0 | 0 | 0 |
| ⋮ | ⋮ | ⋮ | ⋮ | ⋮ | ⋮ | ⋮ | ⋮ |
| C1 | 2 | 90 | 50 | 270 | 0 | 0 | 0 |
| C2 | 2 | 80 | 60 | 180 | 0 | 0 | 0 |
| ⋮ | ⋮ | ⋮ | ⋮ | ⋮ | ⋮ | ⋮ | ⋮ |
| I1 | 3 | 70 | 30 | 0 | -1 | 0.8 | 0 |
| I2 | 3 | 70 | 20 | 90 | 0 | 0 | 0 |
| ⋮ | ⋮ | ⋮ | ⋮ | ⋮ | ⋮ | ⋮ | ⋮ |

Format of substrate 1b    2(2b)

| Component name | Mounting apparatus number | X coordinate | Y coordinate | θ | Deviation X | Deviation Y | Deviation θ |
|---|---|---|---|---|---|---|---|
| R1 | 1 | 100 | 50 | 0 | 0 | 0 | 0 |
| R2 | 1 | 100 | 60 | 90 | 0 | 0 | 0 |
| ⋮ | ⋮ | ⋮ | ⋮ | ⋮ | ⋮ | ⋮ | ⋮ |
| C1 | 2 | 90 | 50 | 270 | 0 | 0 | 0 |
| C2 | 2 | 80 | 60 | 180 | 0 | 0 | 0 |
| ⋮ | ⋮ | ⋮ | ⋮ | ⋮ | ⋮ | ⋮ | ⋮ |
| I1 | 3 | 70 | 30 | 0 | 0 | 0 | 0 |
| I2 | 3 | 70 | 20 | 90 | 0 | 0 | 0 |
| ⋮ | ⋮ | ⋮ | ⋮ | ⋮ | ⋮ | ⋮ | ⋮ |

Format of substrate 1c    2(2c)

| Component name | Mounting apparatus number | X coordinate | Y coordinate | θ | Deviation X | Deviation Y | Deviation θ |
|---|---|---|---|---|---|---|---|
| R1 | 1 | 100 | 50 | 0 | 0 | 0 | 0 |
| R2 | 1 | 100 | 60 | 90 | 0 | 0 | 0 |

Common format of substrate 1a — 2(2a)

| Component name | Mounting apparatus number | X coordinate | Y coordinate | θ | Deviation X | Deviation Y | Deviation θ |
|---|---|---|---|---|---|---|---|
| R1 | 1 | 100 | 50 | 0 | 0 | 0 | 0 |
| R2 | 1 | 100 | 60 | 90 | 0 | 0 | 0 |
| ⋮ | ⋮ | ⋮ | ⋮ | ⋮ | ⋮ | ⋮ | ⋮ |
| C1 | 2 | 90 | 50 | 270 | 0 | 0 | 0 |
| C2 | 2 | 80 | 60 | 180 | 0 | 0 | 0 |
| ⋮ | ⋮ | ⋮ | ⋮ | ⋮ | ⋮ | ⋮ | ⋮ |
| I1 | 3 | 70 | 30 | 0 | -1 | 0.8 | 0 |
| I2 | 3 | 70 | 20 | 90 | 0 | 0 | 0 |
| ⋮ | ⋮ | ⋮ | ⋮ | ⋮ | ⋮ | ⋮ | ⋮ |

Common format of substrate 1b — 2(2b)

| Component name | Mounting apparatus number | X coordinate | Y coordinate | θ | Deviation X | Deviation Y | Deviation θ |
|---|---|---|---|---|---|---|---|
| R1 | 1 | 100 | 50 | 0 | | | |
| R2 | 1 | 100 | 60 | 90 | | | |
| ⋮ | ⋮ | ⋮ | ⋮ | ⋮ | | | |
| C1 | 2 | 90 | 50 | 270 | | | |
| C2 | 2 | 80 | 60 | 180 | | | |
| ⋮ | ⋮ | ⋮ | ⋮ | ⋮ | | | |
| I1 | 3 | 70 | 30 | 0 | | | |
| I2 | 3 | 70 | 20 | 90 | | | |
| ⋮ | ⋮ | ⋮ | ⋮ | ⋮ | | | |

Common format of substrate 1c — 2(2c)

| Component name | Mounting apparatus number | X coordinate | Y coordinate | θ | Deviation X | Deviation Y | Deviation θ |
|---|---|---|---|---|---|---|---|
| R1 | 1 | 100 | 50 | 0 | | | |
| R2 | 1 | 100 | 60 | 90 | | | |

Format of substrate 1o     2(2o)

| Component name | Mounting apparatus number | X coordinate | Y coordinate | θ | Deviation X | Deviation Y | Deviation θ |
|---|---|---|---|---|---|---|---|
| R1 | 1 | 100 | 50 | 0 | | | |
| R2 | 1 | 100 | 60 | 90 | | | |
| ⋮ | ⋮ | ⋮ | ⋮ | ⋮ | | | |
| C1 | 2 | 90 | 50 | 270 | | | |
| C2 | 2 | 80 | 60 | 180 | | | |
| ⋮ | ⋮ | ⋮ | ⋮ | ⋮ | | | |
| I1 | 3 | 70 | 30 | 0 | | | |
| I2 | 3 | 70 | 20 | 90 | | | |
| ⋮ | ⋮ | ⋮ | ⋮ | ⋮ | | | |

Format of substrate 1p     2(2p)

| Component name | Mounting apparatus number | X coordinate | Y coordinate | θ | Deviation X | Deviation Y | Deviation θ |
|---|---|---|---|---|---|---|---|
| R1 | 1 | 100 | 50 | 0 | | | |
| R2 | 1 | 100 | 60 | 90 | | | |
| ⋮ | ⋮ | ⋮ | ⋮ | ⋮ | | | |
| C1 | 2 | 90 | 50 | 270 | | | |
| C2 | 2 | 80 | 60 | 180 | | | |
| ⋮ | ⋮ | ⋮ | ⋮ | ⋮ | | | |
| I1 | [2] | 70 | 30 | 0 | | | |
| I2 | 3 | 70 | 20 | 90 | | | |
| ⋮ | ⋮ | ⋮ | ⋮ | ⋮ | | | |

Format of substrate 1q     2(2q)

| Component name | Mounting apparatus number | X coordinate | Y coordinate | θ | Deviation X | Deviation Y | Deviation θ |
|---|---|---|---|---|---|---|---|
| R1 | 1 | 100 | 50 | 0 | | | |
| R2 | 1 | 100 | 60 | 90 | | | |

Format of substrate 1o — 2(2o)

| Component name | Mounting apparatus number | X coordinate | Y coordinate | θ | Deviation X | Deviation Y | Deviation θ |
|---|---|---|---|---|---|---|---|
| R1 | 1 | 100 | 50 | 0 | 0 | 0 | 0 |
| R2 | 1 | 100 | 60 | 90 | 0 | 0 | 0 |
| ... | ... | ... | ... | ... | ... | ... | ... |
| C1 | 2 | 90 | 50 | 270 | 0 | 0 | 0 |
| C2 | 2 | 80 | 60 | 180 | 0 | 0 | 0 |
| ... | ... | ... | ... | ... | ... | ... | ... |
| I1 | 3 | 70 | 30 | 0 | 0 | 0 | 0 |
| I2 | 3 | 70 | 20 | 90 | 0 | 0 | 0 |
| ... | ... | ... | ... | ... | ... | ... | ... |

Format of substrate 1p — 2(2p)

| Component name | Mounting apparatus number | X coordinate | Y coordinate | θ | Deviation X | Deviation Y | Deviation θ |
|---|---|---|---|---|---|---|---|
| R1 | 1 | 100 | 50 | 0 | 0 | 0 | 0 |
| R2 | 1 | 100 | 60 | 90 | 0 | 0 | 0 |
| ... | ... | ... | ... | ... | ... | ... | ... |
| C1 | 2 | 90 | 50 | 270 | 0 | 0 | 0 |
| C2 | 2 | 80 | 60 | 180 | 0 | 0 | 0 |
| ... | ... | ... | ... | ... | ... | ... | ... |
| I1 | 2 | 70 | 30 | 0 | 2 | 3 | 0 |
| I2 | 3 | 70 | 20 | 90 | 0 | 0 | 0 |
| ... | ... | ... | ... | ... | ... | ... | ... |

Format of substrate 1q — 2(2q)

| Component name | Mounting apparatus number | X coordinate | Y coordinate | θ | Deviation X | Deviation Y | Deviation θ |
|---|---|---|---|---|---|---|---|
| R1 | 1 | 100 | 50 | 0 | | | |
| R2 | 1 | 100 | 60 | 90 | | | |

FIG.11

3(3a)
Format of substrate 1a

| Component name | Mounting apparatus number | Inspection apparatus number | X coordinate | Y coordinate | θ | Deviation X | Deviation Y | Deviation θ |
|---|---|---|---|---|---|---|---|---|
| R1 | 1 | 1 | 100 | 50 | 0 | 0 | 0 | 0 |
| R2 | 1 | 1 | 100 | 60 | 90 | 0 | 0 | 0 |
| . | . | . | . | . | . | . | . | . |
| . | . | . | . | . | . | . | . | . |
| C1 | 2 | 2 | 90 | 50 | 270 | 0 | 0 | 0 |
| C2 | 2 | 2 | 80 | 60 | 180 | 0 | 0 | 0 |
| . | . | . | . | . | . | . | . | . |
| . | . | . | . | . | . | . | . | . |
| I1 | 3 | 3 | 70 | 30 | 0 | -1 | 0.8 | 0 |
| I2 | 3 | 3 | 70 | 20 | 90 | 0 | 0 | 0 |
| . | . | . | . | . | . | . | . | . |
| . | . | . | . | . | . | . | . | . |

3(3b)
Format of substrate 1b

| Component name | Mounting apparatus number | Inspection apparatus number | X coordinate | Y coordinate | θ | Deviation X | Deviation Y | Deviation θ |
|---|---|---|---|---|---|---|---|---|
| R1 | 1 | 1 | 100 | 50 | 0 | 0 | 0 | 0 |
| R2 | 1 | 1 | 100 | 60 | 90 | 0 | 0 | 0 |
| . | . | . | . | . | . | . | . | . |
| . | . | . | . | . | . | . | . | . |
| C1 | 2 | 2 | 90 | 50 | 270 | 0 | 0 | 0 |
| C2 | 2 | 2 | 80 | 60 | 180 | 0 | 0 | 0 |
| . | . | . | . | . | . | . | . | . |
| . | . | . | . | . | . | . | . | . |
| I1 | 3 | 3 | 70 | 30 | 0 | 0 | 0 | 0 |
| I2 | 3 | 3 | 70 | 20 | 90 | 0 | 0 | 0 |
| . | . | . | . | . | . | . | . | . |
| . | . | . | . | . | . | . | . | . |

3(3c)
Format of substrate 1c

| Component name | Mounting apparatus number | Inspection apparatus number | X coordinate | Y coordinate | θ | Deviation X | Deviation Y | Deviation θ |
|---|---|---|---|---|---|---|---|---|
| R1 | 1 | 1 | 100 | 50 | 0 | 0 | 0 | 0 |
| R2 | 1 | 1 | 100 | 60 | 90 | 0 | 0 | 0 |

Format of substrate 1o    3(3o)

| Component name | Mounting apparatus number | Inspection apparatus number | X coordinate | Y coordinate | θ | Deviation X | Deviation Y | Deviation θ |
|---|---|---|---|---|---|---|---|---|
| R1 | 1 | 1 | 100 | 50 | 0 | 0 | 0 | 0 |
| R2 | 1 | 1 | 100 | 60 | 90 | 0 | 0 | 0 |
| ⋮ | ⋮ | ⋮ | ⋮ | ⋮ | ⋮ | ⋮ | ⋮ | ⋮ |
| C1 | 2 | 2 | 90 | 50 | 270 | | | |
| C2 | 2 | 2 | 80 | 60 | 180 | | | |
| ⋮ | ⋮ | ⋮ | ⋮ | ⋮ | ⋮ | | | |
| I1 | 3 | 3 | 70 | 30 | 0 | | | |
| I2 | 3 | 3 | 70 | 20 | 90 | | | |
| ⋮ | ⋮ | ⋮ | ⋮ | ⋮ | ⋮ | | | |

Format of substrate 1p    3(3p)

| Component name | Mounting apparatus number | Inspection apparatus number | X coordinate | Y coordinate | θ | Deviation X | Deviation Y | Deviation θ |
|---|---|---|---|---|---|---|---|---|
| R1 | 1 | 1 | 100 | 50 | 0 | | | |
| R2 | 1 | 1 | 100 | 60 | 90 | | | |
| ⋮ | ⋮ | ⋮ | ⋮ | ⋮ | ⋮ | | | |
| C1 | 2 | 2 | 90 | 50 | 270 | | | |
| C2 | 2 | 2 | 80 | 60 | 180 | | | |
| ⋮ | ⋮ | ⋮ | ⋮ | ⋮ | ⋮ | | | |
| I1 | 3 | 2 | 70 | 30 | 0 | | | |
| I2 | 3 | 3 | 70 | 20 | 90 | | | |
| ⋮ | ⋮ | ⋮ | ⋮ | ⋮ | ⋮ | | | |

Format of substrate 1q    3(3q)

| Component name | Mounting apparatus number | Inspection apparatus number | X coordinate | Y coordinate | θ | Deviation X | Deviation Y | Deviation θ |
|---|---|---|---|---|---|---|---|---|
| R1 | 1 | 1 | 100 | 50 | 0 | | | |
| R2 | 1 | 1 | 100 | 60 | 90 | | | |

| Component name | Mounting apparatus number | Inspection apparatus number | X coordinate | Y coordinate | θ | Deviation X | Deviation Y | Deviation θ | Final deviation X | Final deviation Y | Final deviation θ | Solder | Solder X deviation | Solder Y deviation | Solder θ | Solder deviation X | Solder deviation Y | Solder deviation θ |
|---|---|---|---|---|---|---|---|---|---|---|---|---|---|---|---|---|---|---|
| R1 | 1 | 1 | 100 | 50 | 0 | 0 | 0 | 0 | 0 | 0 | 0 | S1 | 99 | 50 | 90 | 0 | 0 | 0 |
|  |  |  |  |  |  |  |  |  |  |  |  | S2 | 101 | 50 | 90 | 0 | 0 | 0 |
| R2 | 1 | 1 | 100 | 60 | 90 | 0 | 0 | 0 | 0 | 0 | 0 | S3 | 100 | 59 | 0 | 0 | 0 | 0 |
|  |  |  |  |  |  |  |  |  |  |  |  | S4 | 100 | 61 | 0 | 0 | 0 | 0 |
| ... | ... | ... | ... | ... | ... | ... | ... | ... | ... | ... | ... | ... | ... | ... | ... | ... | ... | ... |
| C1 | 2 | 2 | 90 | 50 | 0 | 0 | 0 | 0 | 0 | 0 | 0 | S51 | 89 | 50 | 90 | 0 | 0 | 0 |
|  |  |  |  |  |  |  |  |  |  |  |  | S52 | 91 | 50 | 90 | 0 | 0 | 0 |
| C2 | 2 | 2 | 80 | 60 | 90 | 0 | 0 | 0 | 0 | 0 | 0 | S53 | 80 | 59 | 0 | 0 | 0 | 0 |
|  |  |  |  |  |  |  |  |  |  |  |  | S54 | 80 | 61 | 0 | 0 | 0 | 0 |
| ... | ... | ... | ... | ... | ... | ... | ... | ... | ... | ... | ... | ... | ... | ... | ... | ... | ... | ... |
| I1 | 3 | 3 | 70 | 30 | 0 | -1 | 0.8 | 0 | 0 | 0 | 0 | S101 | 69 | 30 | 90 | 0 | 0 | 0 |
|  |  |  |  |  |  |  |  |  |  |  |  | S102 | 71 | 30 | 90 | 0 | 0 | 0 |
| I2 | 3 | 3 | 70 | 20 | 90 | 0 | 0 | 0 | 0 | 0 | 0 | S103 | 70 | 19 | 0 | 0 | 0 | 0 |
|  |  |  |  |  |  |  |  |  |  |  |  | S104 | 70 | 21 | 0 | 0 | 0 | 0 |
| ... | ... | ... | ... | ... | ... | ... | ... | ... | ... | ... | ... | ... | ... | ... | ... | ... | ... | ... |

FIG.18

MOUNTING SYSTEM FOR MOUNTING ELECTRONIC COMPONENTS

CROSS REFERENCES TO RELATED APPLICATIONS

The present application claims priority to Japanese Priority Patent Application JP 2011-098335 filed in the Japan Patent Office on Apr. 26, 2011, the entire content of which is hereby incorporated by reference.

BACKGROUND

The present disclosure relates to a technique of a mounting system that mounts electronic components on a substrate, and the like.

From the past, there is known a mounting system in which a solder printing apparatus that prints solders on a substrate, a mounting apparatus that mounts electronic components on the substrate, a reflow apparatus that carries out reflow processing on the substrate on which the electronic components are mounted, and the like are arranged in a line (see, for example, Japanese Patent Application Laid-open No. 2002-134998).

In this type of mounting system, an inspection apparatus that inspects the substrate from a downstream side of the apparatus is generally provided for each apparatus. When a processing failure is detected, an inspection result is fed back from the inspection apparatus to be reflected on processing of the next substrate.

In recent years, for raising a mounting tact, a plurality of mounting apparatuses may be connected in a line (see, for example, Japanese Patent Application Laid-open No. 2001-230598). In the mounting apparatuses as described above, for raising a mounting efficiency and the like, when an error such as a positional deviation of an electronic component occurs in a certain mounting apparatus, for example, processing of assigning mounting of that electronic component to another mounting apparatus is executed. In other words, an assignment indicating which mounting apparatus is to mount what electronic component is changed.

SUMMARY

A change in the assignment of mounting of electronic components by the mounting apparatus may occur frequently. When the assignment of mounting of electronic components is changed, there is a problem that the inspection result obtained by the inspection apparatus may not be accurately fed back to the mounting apparatus.

In view of the circumstances as described above, there is a need for a technique of a mounting system and the like in which, when an assignment of mounting of electronic components by a mounting apparatus is changed, an inspection result obtained by an inspection apparatus can be accurately fed back to the mounting apparatus.

According to an embodiment of the present disclosure, there is provided a mounting system including a storage and a controller.

The storage is configured to store a plurality of formats for each substrate.

The plurality of formats include divisional information of a mounting apparatus and information on a deviation amount of an electronic component.

The divisional information of a mounting apparatus indicates which of a plurality of mounting apparatuses that divisionally mount a plurality of electronic components on a substrate mounts what electronic component on the substrate out of the plurality of electronic components.

The information on a deviation amount of an electronic component indicates how much each of the plurality of electronic components that have been mounted on the substrate and inspected by an inspection apparatus that inspects the substrate on which the plurality of electronic components are mounted is deviated from its regular position.

The controller is configured to change, according to a change of an assignment of mounting of the electronic component by the mounting apparatus, the divisional information of the mounting apparatus in a format corresponding to the substrate for which the assignment has been changed, and control the mounting apparatus that has mounted the electronic component and has been specified from the plurality of mounting apparatuses based on the divisional information to mount the electronic component on the substrate after correcting a deviation amount based on the information on a deviation amount of an electronic component.

In the mounting system, a format including the divisional information of a mounting apparatus and the information on a deviation amount of an electronic component is prepared for each substrate. As a result, the mounting system can recognize the mounting apparatus that is assigned to mount the electronic component and the deviation amount of the electronic component for each substrate.

Further, when the assignment of mounting of the electronic components by the mounting apparatus is changed, the controller changes the divisional information in the format corresponding to the substrate for which the assignment of mounting has been changed. As a result, it becomes possible to follow the change of the assignment of mounting in real-time for each substrate. Therefore, the information on a deviation amount (inspection result obtained by inspection apparatus) can be accurately fed back to the mounting apparatus that has mounted the electronic component at a deviated position out of the plurality of mounting apparatuses. The mounting apparatus that has mounted the electronic component at a deviated position can correct the positional deviation of the electronic component based on the deviation amount of the electronic component in the format.

In the mounting system, the information on a deviation amount of an electronic component may be divisionally inspected by a plurality of inspection apparatuses.

In this case, the plurality of formats may further include divisional information of the inspection apparatus that indicates which of the plurality of inspection apparatuses inspects what electronic component out of the plurality of electronic components.

In this case, the controller may change, according to a change of an assignment of the inspection of the electronic component by the inspection apparatus, the divisional information of the inspection apparatus in a format corresponding to the substrate for which the assignment has been changed.

As a result, it becomes possible to flexibly cope with the change of the assignment of the inspection of the electronic components by the inspection apparatus.

In the mounting system, the plurality of formats may further include information on a solder deviation amount that indicates how much a solder, that has been formed on the substrate by a solder forming apparatus that forms a solder on the substrate at a position where the electronic component is to be mounted and inspected by a solder inspection apparatus that inspects the substrate on which the solder is formed, is deviated from its regular position.

In this case, the controller may control the solder forming apparatus to correct the solder forming position based on the information on a solder deviation amount in the format.

In the mounting system, when a positional deviation of a solder occurs, the solder forming position can be corrected appropriately.

In the mounting system, the controller may control each of the plurality of mounting apparatuses to mount the electronic component on the solder formed at the position deviated from the regular position based on the information on a solder deviation amount.

In the mounting system, when a positional deviation of a solder occurs, the electronic component can be accurately mounted on the positionally-deviated solder. It should be noted that when the positional deviation of a solder is small, there is often no problem even when the electronic component is mounted on the positionally-deviated solder.

According to another embodiment of the present disclosure, there is provided an electronic component mounting method including changing, regarding a plurality of formats for each substrate including divisional information of a mounting apparatus that indicates which of a plurality of mounting apparatuses that divisionally mount a plurality of electronic components on a substrate mounts what electronic component on the substrate out of the plurality of electronic components and information on a deviation amount of an electronic component that indicates how much each of the plurality of electronic components that have been mounted on the substrate and inspected by an inspection apparatus that inspects the substrate on which the plurality of electronic components are mounted is deviated from its regular position, according to a change of an assignment of mounting of the electronic component by the mounting apparatus, the divisional information of the mounting apparatus in a format corresponding to the substrate for which the assignment has been changed.

The mounting apparatus that has mounted the electronic component and has been specified from the plurality of mounting apparatuses based on the divisional information is controlled to mount the electronic component on the substrate after correcting a deviation amount based on the information on a deviation amount of an electronic component.

According to another embodiment of the present disclosure, there is provided a substrate production method including changing, regarding a plurality of formats for each substrate including divisional information of a mounting apparatus that indicates which of a plurality of mounting apparatuses that divisionally mount a plurality of electronic components on a substrate mounts what electronic component on the substrate out of the plurality of electronic components and information on a deviation amount of an electronic component that indicates how much each of the plurality of electronic components that have been mounted on the substrate and inspected by an inspection apparatus that inspects the substrate on which the plurality of electronic components are mounted is deviated from its regular position, according to a change of an assignment of mounting of the electronic component by the mounting apparatus, the divisional information of the mounting apparatus in a format corresponding to the substrate for which the assignment has been changed.

The mounting apparatus that has mounted the electronic component and has been specified from the plurality of mounting apparatuses based on the divisional information is controlled to mount the electronic component on the substrate after correcting a deviation amount based on the information on a deviation amount of an electronic component.

According to another embodiment of the present disclosure, there is provided a program that causes a computer to execute the steps of:

changing, regarding a plurality of formats for each substrate including divisional information of a mounting apparatus that indicates which of a plurality of mounting apparatuses that divisionally mount a plurality of electronic components on a substrate mounts what electronic component on the substrate out of the plurality of electronic components and information on a deviation amount of an electronic component that indicates how much each of the plurality of electronic components that have been mounted on the substrate and inspected by an inspection apparatus that inspects the substrate on which the plurality of electronic components are mounted is deviated from its regular position, according to a change of an assignment of mounting of the electronic component by the mounting apparatus, the divisional information of the mounting apparatus in a format corresponding to the substrate for which the assignment has been changed; and controlling the mounting apparatus that has mounted the electronic component and has been specified from the plurality of mounting apparatuses based on the divisional information to mount the electronic component on the substrate after correcting a deviation amount based on the information on a deviation amount of an electronic component.

As described above, according to the embodiments of the present disclosure, it is possible to provide a technique of a mounting system and the like in which, when the assignment of mounting of the electronic components by the mounting apparatus is changed, an inspection result obtained by the inspection apparatus can be accurately fed back to the mounting apparatus.

Additional features and advantages are described herein, and will be apparent from the following Detailed Description and the figures.

BRIEF DESCRIPTION OF THE FIGURES

FIG. 3 is a diagram showing an example of a format used in the mounting system according to the embodiment of the present disclosure;

FIG. 7 is a complementary diagram for explaining processing of the mounting system according to the embodiment of the present disclosure and shows an example of the format for each substrate at the same time as in FIG. 6;

FIG. 9 is a complementary diagram for explaining processing of the mounting system according to the embodiment of the present disclosure and shows an example of the format for each substrate at the same time as in FIG. 8;

FIG. 11 is a complementary diagram for explaining processing of the mounting system according to the embodiment of the present disclosure and shows an example of the format for each substrate at the same time as in FIG. 10;

FIG. 13 is a diagram showing an example of the format used in the mounting system according to the another embodiment;

FIG. 16 is a complementary diagram for explaining processing of the mounting system according to the another embodiment and shows an example of the format for each substrate at the same time as in FIG. 15;

FIG. 18 is a diagram showing an example of the format used in the mounting system according to the another embodiment.

DETAILED DESCRIPTION

Hereinafter, embodiments of the present disclosure will be described with reference to the drawings.

First Embodiment

[Overall Structure of Mounting System and Structures of Components]

Figure 1:
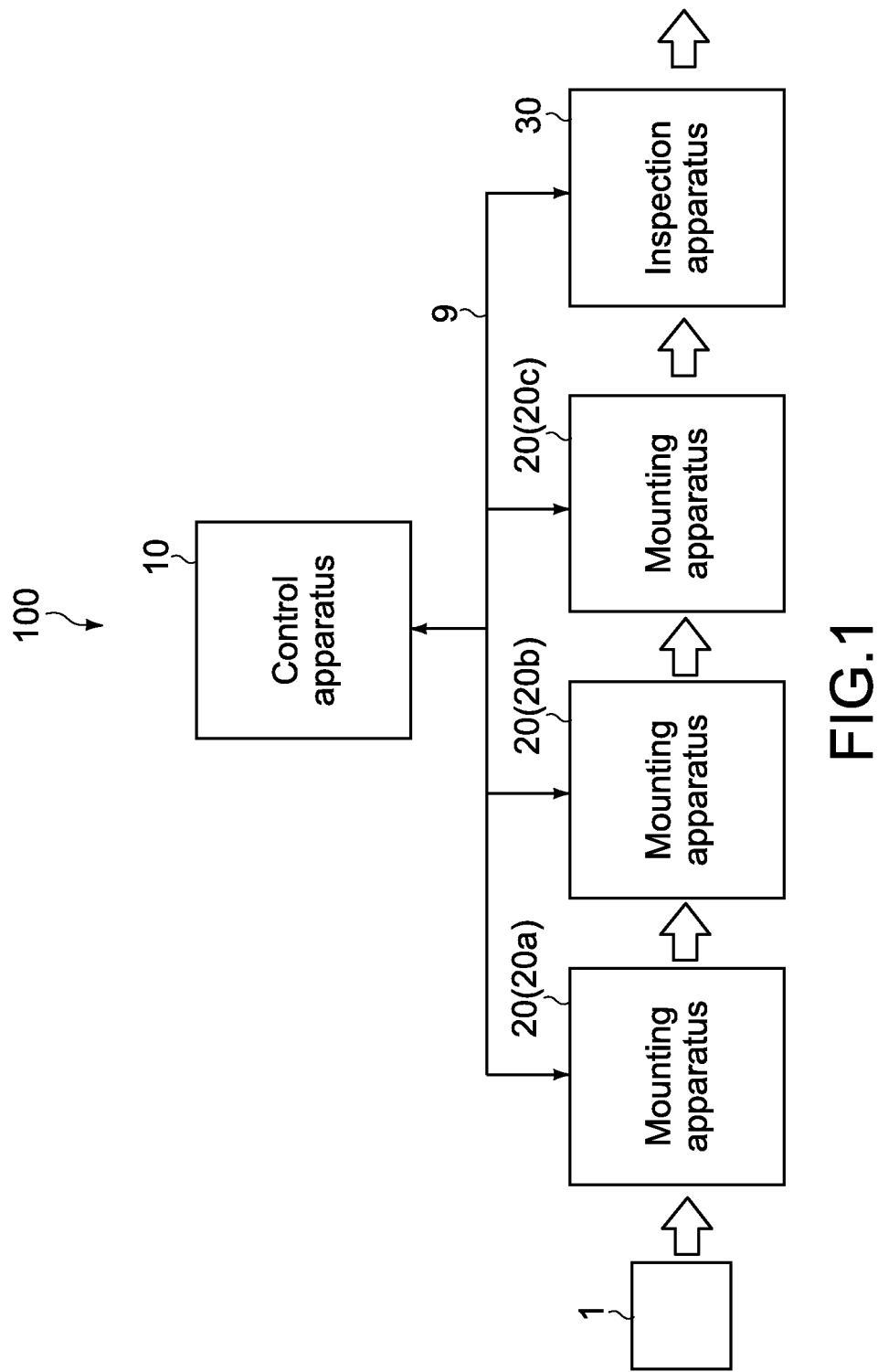
FIG. 1 is a diagram showing a mounting system according to an embodiment of the present disclosure.

FIG. 1 is a diagram showing a mounting system 100 according to a first embodiment of the present disclosure. As shown in FIG. 1, the mounting system 100 includes a plurality of mounting apparatuses 20 that divisionally mount a plurality of electronic components on a substrate 1, an inspection apparatus 30 that inspects the substrate 1 on which the electronic components are mounted by the plurality of mounting apparatuses 20, and a control apparatus 10 that controls the plurality of mounting apparatuses 20 and the inspection apparatus 30. The plurality of mounting apparatuses 20 and the inspection apparatus 30 are connected in a line.

The control apparatus 10, the plurality of mounting apparatuses 20, and the inspection apparatus 30 are mutually connected while being communicable with one another via a communication cable 9.

The number of mounting apparatuses 20 is 3 in this embodiment. It should be noted that when distinguishing the 3 mounting apparatuses 20 from one another in particular in the descriptions of this embodiment, the mounting apparatuses 20 are referred to as first mounting apparatus 20a, second mounting apparatus 20b, and third mounting apparatus 20c from an upstream side of the substrate 1.

Figure 2:
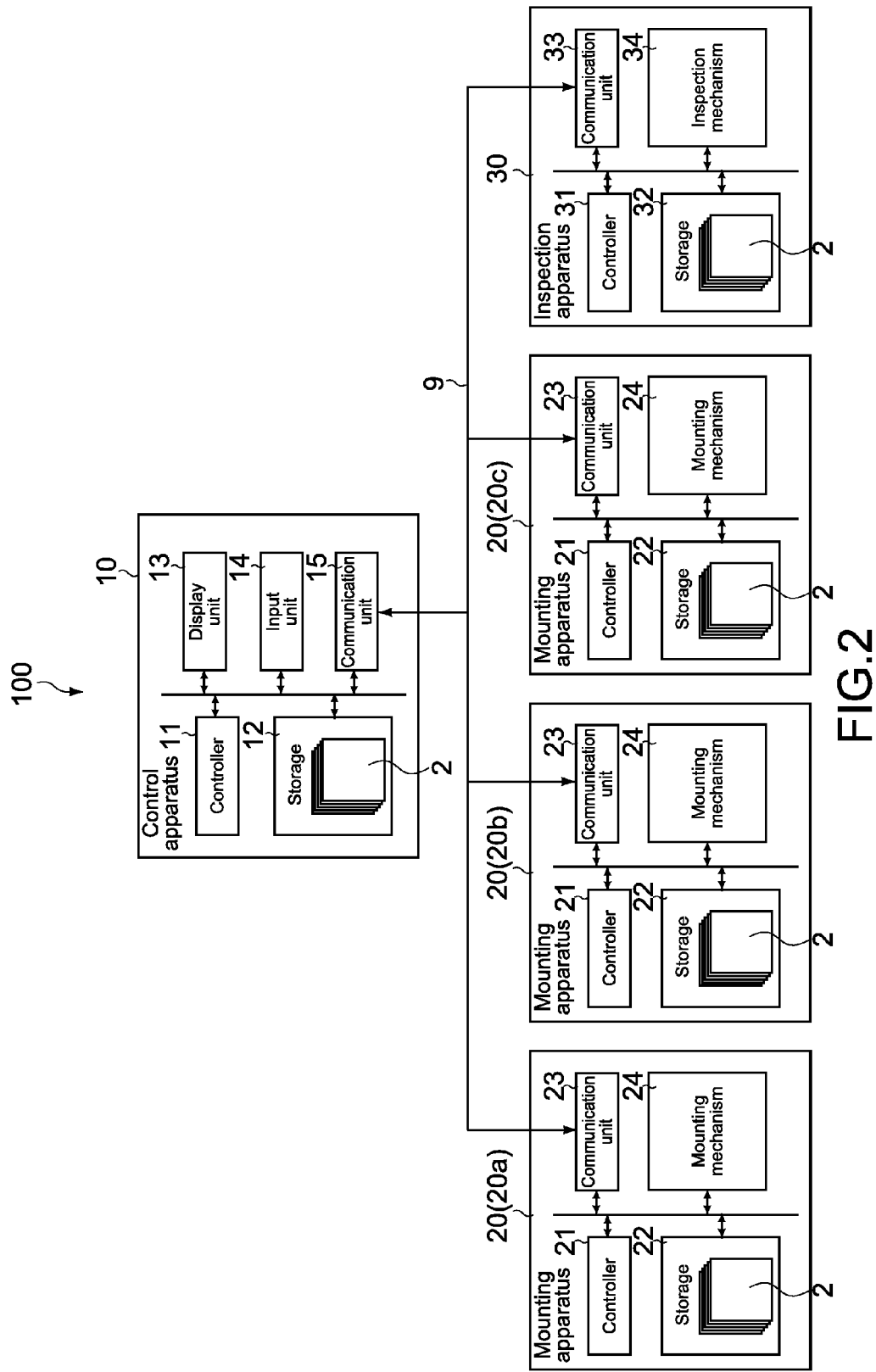
FIG. 2 is a diagram showing an electrical structure of the mounting system according to the embodiment of the present disclosure.

FIG. 2 is a diagram showing an electrical structure of the mounting system 100. As shown in FIG. 2, the control apparatus 10 includes a controller 11, a storage 12, a display unit 13, an input unit 14, and a communication unit 15.

The controller 11 is, for example, a CPU (Central Processing Unit) and collectively controls the components of the control apparatus 10.

The storage 12 includes a nonvolatile memory (e.g., HD (Hard Disc) and ROM (Read Only Memory)) that stores various programs requisite for control by the controller 11. The storage 12 also includes a volatile memory (e.g., RAM (Random Access Memory)) that is used as a working area of the controller 11. The storage 12 stores a plurality of formats 2 that are prepared for each substrate 1, the details of which will be given later.

The communication unit 15 transmits and receives information to/from the mounting apparatuses 20 and the inspection apparatus 30.

The display unit 13 is constituted of, for example, a liquid crystal display or an EL (Electro Luminescence) display. The display unit 13 displays the format 2 on a screen as necessary. The input unit 14 is constituted of a keyboard, a mouse, and the like and inputs an instruction from a user based on a user operation.

The plurality of mounting apparatuses 20 each include a controller 21, a storage 22, a communication unit 23, and a mounting mechanism 24.

The controller 21 is, for example, a CPU and collectively controls the components of the mounting apparatus 20. The storage 22 includes a nonvolatile memory that stores various programs requisite for control by the controller 21 and a volatile memory that is used as a working area of the controller 21. The storage 22 stores the plurality of formats 2 prepared for each substrate 1.

The communication unit 23 transmits and receives information to/from the control apparatus 10, the inspection apparatus 30, and the other mounting apparatuses 20.

The mounting mechanism 24 includes a conveyor portion such as a conveyor that conveys the substrate 1, a supply portion that supplies electronic components, one or a plurality of mounting heads that mount the electronic components, and a movement portion that moves the mounting heads.

The supply portion includes a plurality of carrier tapes that store electronic components such as an IC (Integrated Circuit) chip, a resistor R, a capacitor C, and an inductor I for each type. The mounting head includes one or a plurality of sucking nozzles that suck and hold the electronic components supplied from the supply portion. The mounting head sucks the electronic components by the sucking nozzle(s) at a supply position of the electronic components and moves to a position above the substrate 1. Then, the sucking nozzle(s) is lowered so that the electronic components are mounted on the substrate 1.

The mounting of the electronic components is executed in the order of the first mounting apparatus 20a, the second mounting apparatus 20b, and the third mounting apparatus 20c. The first mounting apparatus 20a hands over the substrate 1 to the second mounting apparatus 20b upon ending the mounting of the electronic components assigned to itself, and the second mounting apparatus 20b hands over the substrate 1 to the third mounting apparatus 20c upon ending the mounting of the electronic components assigned to itself. The final third mounting apparatus 20c hands over the substrate 1 to the inspection apparatus 30 upon ending the mounting of the electronic components assigned to itself.

The inspection apparatus 30 includes a controller 31, a storage 32, a communication unit 33, and an inspection mechanism 34.

The controller 31 is, for example, a CPU and collectively controls the components of the inspection apparatus 30. The storage 32 includes a nonvolatile memory that stores various programs requisite for control by the controller 31 and a volatile memory that is used as a working area of the controller 31. The storage 32 stores the plurality of formats 2 prepared for each substrate 1.

The communication unit 33 transmits and receives information to/from the control apparatus 10 and the mounting apparatuses 20.

The inspection mechanism 34 includes a conveyor portion such as a conveyor that conveys the substrate 1 on which the electronic components have been mounted by the mounting apparatus 20 and an image pickup portion that picks up an image of the substrate 1 (electronic components) positioned as an inspection position. The image pickup portion is constituted of, for example, a CCD (Charge Coupled Device) sensor or a CMOS (Complementary Metal Oxide Semiconductor) sensor.

The controller 31 of the inspection apparatus 30 analyzes an image taken by the image pickup portion and judges an actual position of the electronic component. Then, the controller 31 compares the actual position of the electronic component with a regular position of the electronic component and calculates a deviation amount of the electronic component.

FIG. 3 is a diagram showing an example of the format 2 used in the first embodiment.

As shown in FIG. 3, the format 2 is prepared for each substrate 1. The format 2 is commonly used by the control apparatus 10, the plurality of mounting apparatuses 20 and the inspection apparatus 30. The format 2 includes information on a component name for identifying the plurality of electronic components. For example, in the component name column, resistors are identified as component names of R1, R2, . . . , capacitors are identified as component names of C1, C2, . . . , and inductors are identified as component names of I1, I2, . . . .

The format 2 also includes, for each of the electronic components, information on a number of the mounting apparatus that mounts the corresponding electronic component. In other words, the format 2 includes divisional information of a mounting apparatus that indicates which of the plurality of mounting apparatuses 20 mounts what electronic component on the substrate 1. For example, in the column of the mounting apparatus number, any one of 1 to 3 is allocated. The numbers 1 to 3 correspond to the first mounting apparatus 20a, the second mounting apparatus 20b, and the third mounting apparatus 20c.

The format 2 also includes, for each of the electronic components, information on a position at which an electronic component is to be mounted (XY coordinates and tilt θ from reference point).

In addition, the format 2 includes, for each of the electronic components, information on a deviation amount of an electronic component (deviation amounts in X, Y and θ directions). In other words, the format 2 includes information on a deviation amount of an electronic component that indicates how much each of the electronic components is deviated from its regular position on the substrate 1.

[Explanation on Operation]

Figure 4:
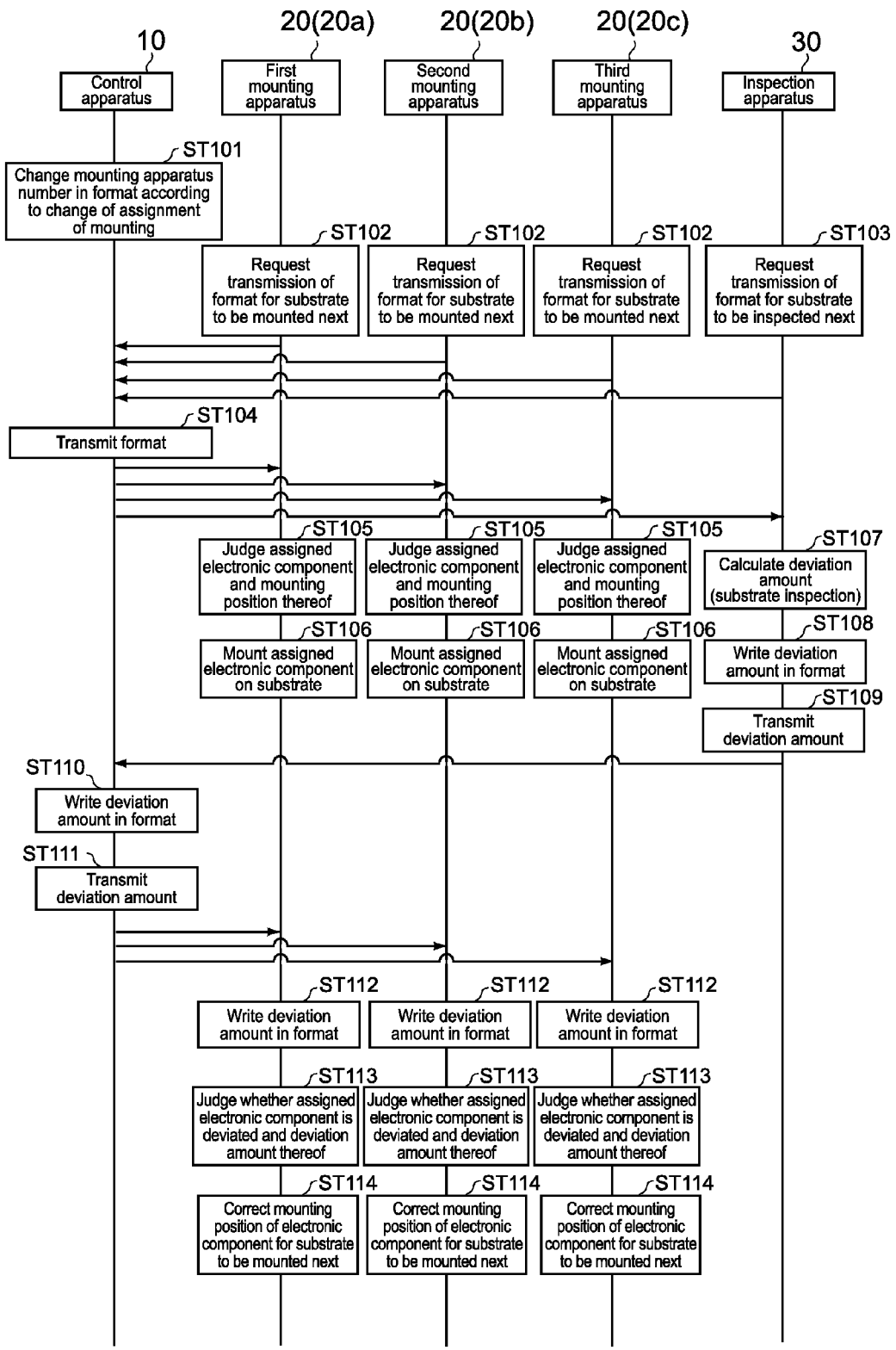
FIG. 4 is a sequence diagram showing an operation of the mounting system according to the embodiment of the present disclosure.

Next, an operation of the mounting system 100 will be described. FIG. 4 is a sequence diagram showing the operation of the mounting system 100.

The controller 11 of the control apparatus 10 executes processing of changing, according to a change of an assignment of mounting of electronic components by the mounting apparatus 20, the number of the mounting apparatus 20 (divisional information) in the format 2 corresponding to the substrate 1 for which the assignment of mounting has been changed in real time (Step 101).

For example, when an error such as a positional deviation of an electronic component occurs in any of the 3 mounting apparatuses 20, a mounting time in the mounting apparatus 20 in which the error has occurred may become longer than that of other mounting apparatuses 20 in which an error has not occurred. In this case, the mounting times of the mounting apparatuses 20 in which an error has not occurred need to be made the same as that of the mounting apparatus 20 in which the error has occurred, with the result that a mounting tact may be lowered. In this regard, in such a case, the electronic components that the mounting apparatus 20 in which the error has occurred has been assigned to mount need to be assigned to the other mounting apparatuses 20 in which an error has not occurred.

In Step 101, when the assignment of mounting is changed as described above, the controller 11 of the control apparatus 10 executes processing of changing the number of the mounting apparatus 20 in the format 2 corresponding to the substrate 1 for which the assignment of mounting has been changed. It should be noted that for brevity of description, details on the processing of the mounting system 100 in a case where the assignment of mounting of electronic components by the mounting apparatus 20 is changed will be given later, and a case where the assignment of mounting is not changed will be described first.

The controller 21 of each mounting apparatus 20 transmits a signal of a transmission request for a format 2 corresponding to the substrate 1 on which the electronic components are to be mounted next to the control apparatus 10 via the communication unit 23 (Step 102). Further, the controller 31 of the inspection apparatus 30 transmits a signal of a transmission request for a format 2 corresponding to the substrate 1 that is to be inspected next to the control apparatus 10 via the communication unit 33 (Step 103).

Upon receiving the transmission request signal for a format 2 from each mounting apparatus 20, the controller 11 of the control apparatus 10 transmits the requested format 2 to each mounting apparatus 20 (Step 104). Similarly, upon receiving the transmission request signal for a format 2 from the inspection apparatus 30, the controller 11 of the control apparatus 10 transmits the requested format 2 to the inspection apparatus 30 (Step 104).

It should be noted that in Step 104, the format 2 transmitted from the control apparatus 10 is blank, and information on a deviation amount of an electronic component is not yet written at this time point.

Figure 5:
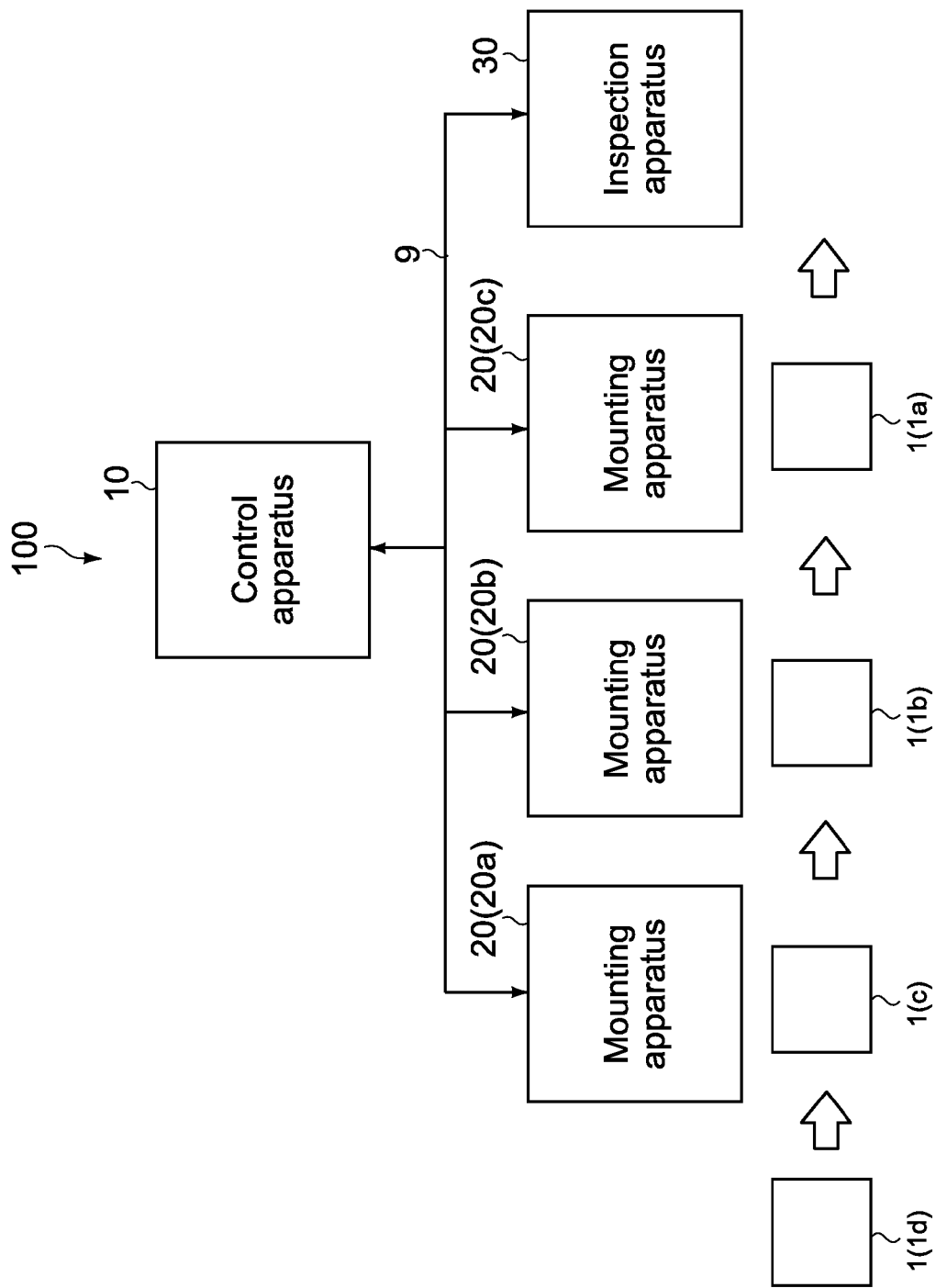
FIG. 5 is a complementary diagram for explaining processing of the mounting system and shows substrate positions at a certain time.

Here, referring to FIG. 5, the processes of Steps 102 to 104 will be specifically described based on an example. FIG. 5 shows a state where the first mounting apparatus 20a, the second mounting apparatus 20b, and the third mounting apparatus 20c have ended mounting of substrates 1c, 1b, and 1a, respectively.

In this case, the substrate 1 on which the electronic component is to be mounted next by the first mounting apparatus 20a is the substrate 1d. Therefore, at a time point the first mounting apparatus 20a ends mounting of the substrate 1c, the first mounting apparatus 20a transmits a transmission request signal for a format 2d corresponding to the substrate 1d to the control apparatus 10 in Step 102. Similarly, the substrates 1 on which the electronic components are to be mounted next by the second mounting apparatus 20b and the third mounting apparatus 20c are the substrates 1c and 1b. Therefore, at the time point shown in FIG. 5, the second mounting apparatus 20b and the third mounting apparatus 20c transmit transmission request signals for formats 2c and 2b corresponding to the substrates 1c and 1b to the control apparatus 10 in Step 102.

Further, at the time point shown in FIG. 5, the substrate 1 that is to be inspected next by the inspection apparatus 30 is the substrate 1a. Therefore, in Step 103, the inspection apparatus 30 transmits a transmission request signal for a format 2a corresponding to the substrate 1a to the control apparatus 10.

Then, in Step 104, the control apparatus 10 transmits the formats 2 requested by the mounting apparatuses 20 and the inspection apparatus 30.

Upon receiving the format 2 from the control apparatus 10 via the communication unit 23, the controller 21 of each mounting apparatus 20 stores the received format 2 in the storage 22. Then, the controller 21 of each mounting apparatus 20 judges the electronic component that the mounting apparatus 20 itself is assigned to mount and a mounting position of the electronic component based on the format 2 (Step 105). In the format 2, the component name of the electronic component, the number of the mounting apparatus that is assigned to mount the electronic component, and the mounting position of the electronic component are associated with one another. Therefore, the controller 21 of each mounting apparatus 20 can judge the electronic component that the mounting apparatus itself is assigned to mount and the mounting position of the electronic component based on the format 2.

Next, the mounting apparatus 20 mounts the electronic component that the mounting apparatus itself is assigned to mount on the substrate 1 (Step 106). In this case, the mounting apparatus 20 moves the mounting head to a supply position of the electronic component and sucks the electronic component by the sucking nozzle. After that, the mounting apparatus 20 moves the mounting head to a position above the substrate 1 and lowers the sucking nozzle to mount the electronic component on the substrate 1.

Upon ending mounting of the electronic component that the mounting apparatus itself is assigned to mount, the mounting apparatus 20 hands over the substrate 1 to the next mounting apparatus 20 (inspection apparatus 30 for third mounting apparatus 20c). Then, the mounting apparatus 20 again transmits a transmission request signal for a format 2 corresponding to the substrate 1 on which an electronic component is to be mounted next to the control apparatus 10 (Step 102). After that, the processes of Steps 102, 105, and 106 are repeated.

Upon receiving the format 2 from the control apparatus 10 via the communication unit 33, the controller 31 of the inspection apparatus 30 stores the format 2 in the storage 32. Then, the controller 31 of the inspection apparatus 30 calculates a deviation amount of the electronic component based on the format 2 (Step 107).

In the format 2, the component name of the electronic component and the mounting position of the electronic component are associated with each other. Therefore, the inspection apparatus 30 can calculate the deviation amount of the electronic component based on the format 2. In this case, for example, the controller 31 of the inspection apparatus 30 judges an actual position of the electronic component by analyzing an image taken by the image pickup portion. Then, the controller 31 of the inspection apparatus 30 calculates the deviation amount of the electronic component by comparing the judged actual position of the electronic component and the regular position of the electronic component (mounting position of electronic component in format 2).

Upon calculating the deviation amount of the electronic component, the controller 31 of the inspection apparatus 30 writes the information on the deviation amount of the electronic component in the format 2 corresponding to the inspected substrate 1 and stores it in the storage 32 (Step 108). Then, the controller 31 of the inspection apparatus 30 transmits the information on the deviation amount of the electronic component to the control apparatus 10 via the communication unit 33 (Step 109).

Upon transmitting the information on the deviation amount of the electronic component to the control apparatus 10, the controller 31 of the inspection apparatus 30 again transmits a transmission request signal for a format 2 corresponding to the substrate 1 that is to be inspected next to the control apparatus 10 (Step 103). After that, the controller 31 of the inspection apparatus 30 repeats the processes of Steps 103 and 107 to 109.

Upon receiving the information on the deviation amount from the inspection apparatus 30, the controller 11 of the control apparatus 10 writes the deviation amount in the format 2 and stores it in the storage 12 (Step 110). In this case, the controller 11 of the control apparatus 10 writes the deviation amount in the format 2 corresponding to the substrate 1 whose deviation amount has been inspected and stores it in the storage 12. Then, the controller 11 of the control apparatus 10 transmits the information on the deviation amount of the electronic component to each mounting apparatus 20 (Step 111). As a result, the deviation amount of the electronic component is fed back to each mounting apparatus 20.

Upon receiving the information on the deviation amount of the electronic component from the control apparatus 10, the controller 21 of each mounting apparatus 20 writes the deviation amount in the format 2 and stores it in the storage 22 (Step 112). In this case, the controller 21 of each mounting apparatus 20 writes the deviation amount in the format 2 corresponding to the substrate 1 whose deviation amount has been inspected and stores it in the storage 22. Since each mounting apparatus 20 has already acquired the format 2 corresponding to the substrate 1 whose deviation amount has been inspected in Step 102, the deviation amount of the electronic component only needs to be written in the column of the deviation amount of an electronic component in the format 2.

Next, the controller 21 of each mounting apparatus 20 judges whether the electronic component that the mounting apparatus itself is assigned to mount is deviated and a deviation amount of the electronic component based on the format 2 (Step 113). In the format 2, the component name of the electronic component, the number of the mounting apparatus that has mounted the electronic component, and the deviation amount of the electronic component are associated with one another. Therefore, the controller 21 of each mounting apparatus 20 can judge whether the electronic component that the mounting apparatus itself is assigned to mount is deviated and the deviation amount of the electronic component based on the format 2.

For example, the controller 21 of the first mounting apparatus 20a judges whether an electronic component whose column of the number of the mounting apparatus is assigned with 1 in the format 2 is deviated and the deviation amount of the electronic component. Similarly, the controllers 21 of the second mounting apparatus 20b and the third mounting apparatus 20c judge whether electronic components whose columns of the number of the mounting apparatus are assigned with 2 and 3 in the format 2 are deviated and the deviation amount of the electronic components.

Upon judging the deviation amount of the electronic component, the controller 21 of each mounting apparatus 20 mounts, on the substrate 1 to be mounted next, the electronic component after correcting the deviation amount based on the deviation amount of the electronic component (Step 114).

Figure 6:
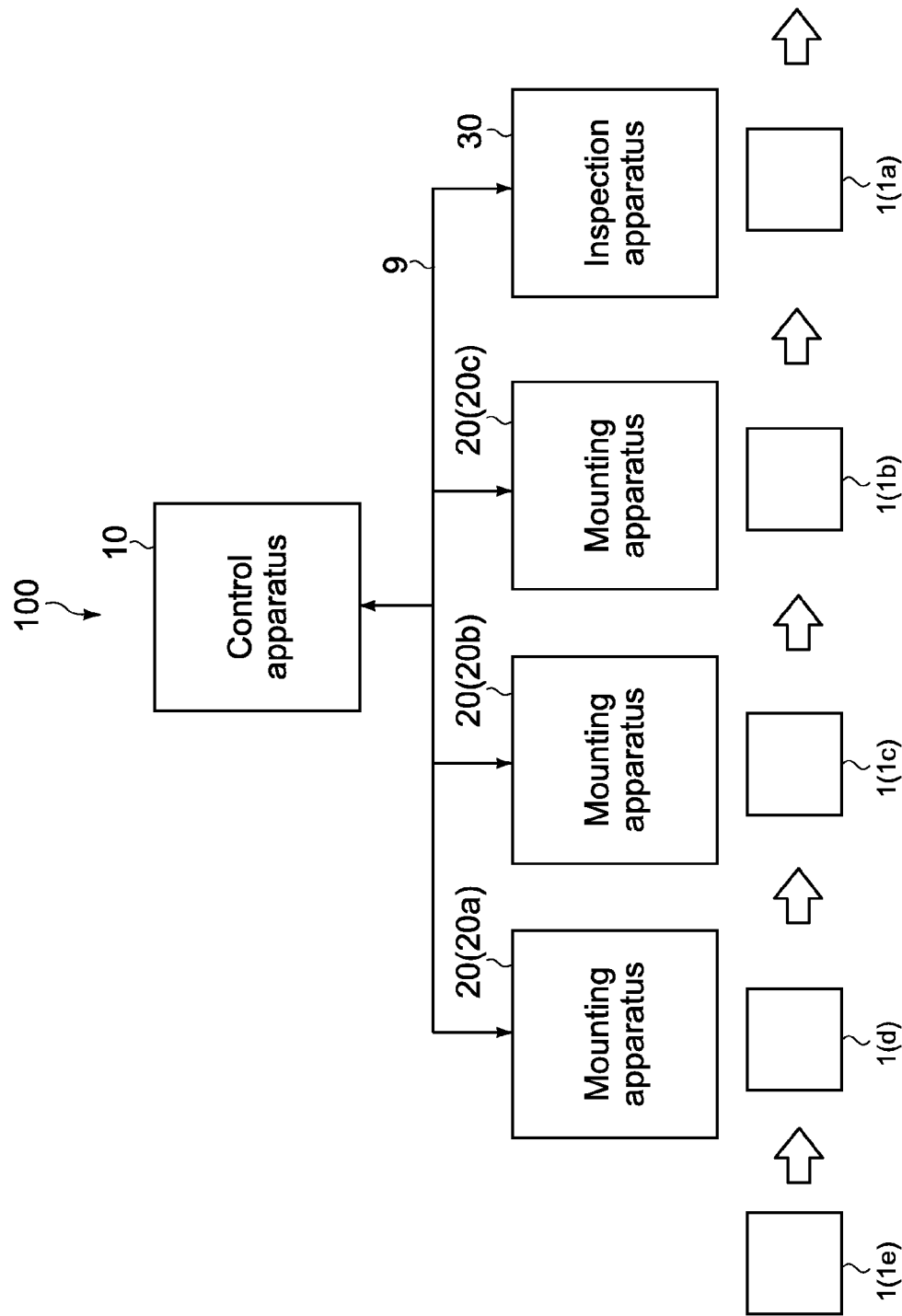
FIG. 6 is a complementary diagram for explaining processing of the mounting system according to the embodiment of the present disclosure and shows substrate positions at a certain time.

Here, referring to FIGS. 6 and 7, the processes of Steps 112 to 114 shown in FIG. 4 will be specifically described based on an example.

FIG. 6 shows a state where an inspection of the substrate 1*a* by the inspection apparatus 30 and mounting of the substrates 1*d*, 1*c*, and 1*b* by the first mounting apparatus 20*a*, the second mounting apparatus 20*b*, and the third mounting apparatus 20*c* have ended.

FIG. 7 is a diagram showing an example of the format 2 of each substrate 1 at a time the deviation amount of an electronic component is written in a format 2*a* corresponding to the substrate 1*a* after the inspection on the substrate 1*a* is ended. Specifically, FIG. 7 is a diagram showing an example of the format 2 for each substrate 1 at a time point shown in FIG. 6. FIG. 7 shows an example of a case where a mounting position of an electronic component I1 (inductor) is deviated on the substrate 1*a*. It should be noted that the substrate 1*b* and the subsequent substrates are not yet inspected by the inspection apparatus 30 at this time point. Therefore, as shown in FIG. 7, the columns of the deviation amount of an electronic component in the formats 2*b*, 2*c*, . . . corresponding to the substrate 1*b* and the subsequent substrates are blank.

When the inspection on the substrate 1*a* is ended and the deviation amount is written in the format 2*a* corresponding to the substrate 1*a* (Step 112), the controller 21 of each mounting apparatus 20 refers to the format 2*a* corresponding to the substrate 1*a*. Then, the controller 21 of each mounting apparatus 20 judges whether the electronic component that the mounting apparatus itself is assigned to mount is deviated and the deviation amount of the electronic component based on the format 2*a* corresponding to the substrate 1*a* (Step 113).

In this case, the controller 21 of the first mounting apparatus 20*a* judges whether the electronic component whose number of the mounting apparatus is assigned with 1 in the format 2*a* corresponding to the substrate 1*a* is deviated and the deviation amount of the electronic component. The second mounting apparatus 20*b* only needs to refer to a portion where the number of the mounting apparatus is 2, and the third mounting apparatus 20*c* only needs to refer to a portion where the number of the mounting apparatus is 3.

In the format 2*a* corresponding to the substrate 1*a* in the example shown in FIG. 7, the electronic component I1 (inductor) assigned to be mounted by the third mounting apparatus 20*c* is deviated −1 mm in the X direction and 0.8 mm in the Y direction from the regular position. Therefore, in this case, the controller 21 of the third mounting apparatus 20*c* mounts, on the substrate 1 to be mounted next, an electronic component C1 at a position obtained by deviating the electronic component I1+1 mm in the X direction and −8 mm in the Y direction for correcting the deviation amount of the electronic component I1 (Step 114).

Referring to FIG. 6, at this time point, the substrate 1 to be mounted next by the third mounting apparatus 20*c* is the substrate 1*c* that is handed over from the second mounting apparatus 20*b*. Therefore, in this case, the third mounting apparatus 20*c* corrects the deviation amount of the electronic component on the substrate 1*c* to be mounted next. The substrates 1*d*, 1*e*, . . . to be mounted after that by the third mounting apparatus 20*c* are similarly mounted with electronic components at positions obtained by correcting the deviation amount as in the case of the substrate 1*c*.

It should be noted that the substrate 1 to be mounted next by the first mounting apparatus 20*a* is the substrate 1*e*. Therefore, for the substrate 1*e*, if any of the electronic components that the first mounting apparatus 20*a* is assigned to mount is deviated, the controller 21 of the first mounting apparatus 20*a* corrects the deviation amount of the electronic component on the substrate 1*e* to be mounted next.

Further, the substrate 1 to be mounted next by the second mounting apparatus 20*b* is the substrate 1*d*. Therefore, for the substrate 1*d*, if any of the electronic components that the second mounting apparatus 20*b* is assigned to mount is deviated, the controller 21 of the second mounting apparatus 20*b* corrects the deviation amount of the electronic component on the substrate 1*d* to be mounted next.

It should be noted that in the example shown in FIG. 4, the descriptions have been given on the case where each mounting apparatus 20 judges whether the electronic component that the mounting apparatus itself is assigned to mount is deviated and the deviation amount of the electronic component based on the format 2 in Step 113. However, this process may be executed by the control apparatus 10. In this case, the controller 11 of the control apparatus 10 judges which of the electronic components mounted by what mounting apparatus 20 is deviated based on the format 2. Then, the controller 11 of the control apparatus 10 only needs to transmit a signal for correcting a deviation amount of the electronic component mounted at the deviated position to the mounting apparatus 20 that has mounted the electronic component at the deviated position.

Next, the processing of the mounting system 100 in a case where the assignment of mounting of electronic components by the mounting apparatus 20 is changed will be specifically described based on an example.

Figure 8:
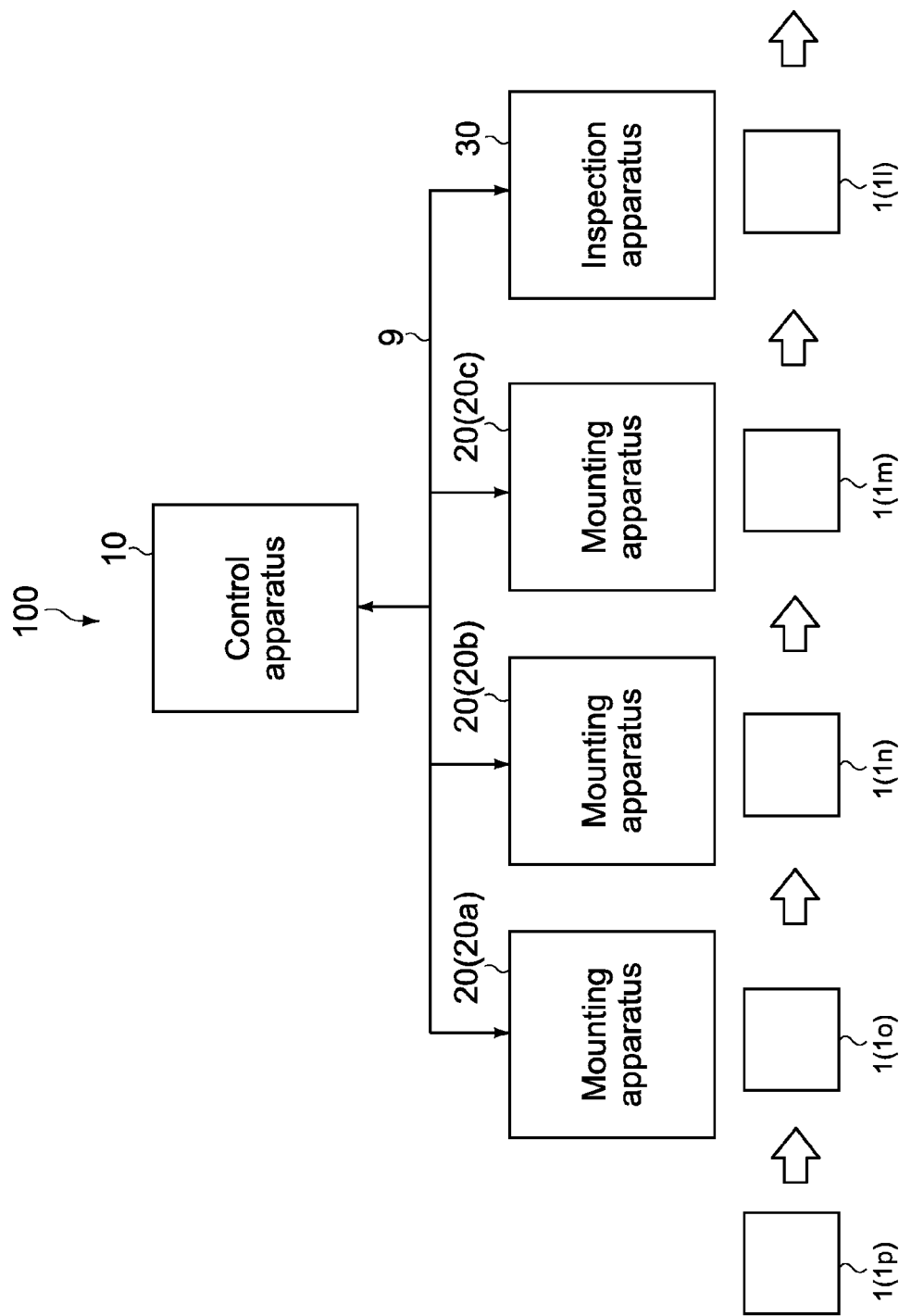
FIG. 8 is a complementary diagram for explaining processing of the mounting system according to the embodiment of the present disclosure and shows substrate positions at a certain time.

FIG. 8 is a complementary diagram for explaining the processing of the mounting system 100 in the case where the assignment of mounting of electronic components by the mounting apparatus 20 is changed. FIG. 8 shows a state where an inspection of a substrate 1*1* by the inspection apparatus 30 and mounting of substrates 1*o*, 1*n*, and 1*m* by the first mounting apparatus 20*a*, the second mounting apparatus 20*b*, and the third mounting apparatus 20*c* are ended.

FIG. 9 is a diagram showing an example of the format 2 for each substrate 1 at the time point shown in FIG. 8. FIG. 9 shows the format 2 stored in the storage 12 of the control apparatus 10.

Here, for example, a case where the controller 11 of the control apparatus 10 changes the assignment of mounting of the electronic component I1 from the third mounting apparatus 20*c* to the second mounting apparatus 20*b* for raising a mounting tact will be discussed.

In this case, the controller 11 of the control apparatus 10 executes processing of changing the number of the mounting apparatus corresponding to the electronic component I1 from 3 to 2 in a format 2*p* of a substrate 1*p* that is not yet mounted with an electronic component (substrate 1*p* on which electronic component is to be mounted by first mounting apparatus 20*a*) (see FIG. 8) (Step 101). It should be noted that also for the formats 2*q*, 2*r*, . . . corresponding to the substrate 1*q* and the subsequent substrates, the processing of changing the number of the mounting apparatus corresponding to the electronic component I1 from 3 to 2 is executed.

As a result, while the number of the mounting apparatus corresponding to the electronic component I1 is 3 in the format 2 corresponding to the substrate 1 before the substrate 1*o*, the number is 2 in the formats 2*p*, 2*q*, . . . corresponding to the substrate 1*p* and the subsequent substrates 1.

When the mounting apparatus 20 mounts an electronic component on the substrate 1*p*, the mounting apparatus 20 refers to the column of the number of the mounting apparatus in the format 2*p* corresponding to the substrate 1*p* to judge the component assigned to itself and mounts the electronic component on the substrate 1 (Steps 113 and 114). At this time, since the number of the mounting apparatus corresponding to the electronic component I1 is changed from 3 to 2 in the format 2p, the electronic component I1 is mounted by the second mounting apparatus 20b on the substrate 1p and the subsequent substrates.

In the descriptions herein, the descriptions have been given on the case where the number of the mounting apparatus corresponding to the electronic component I1 is changed from 3 to 2 in the formats 2p, 2q, . . . corresponding to the substrate 1p and the subsequent substrates 1 when a change of the assignment of mounting is determined in the state shown in FIG. 8. However, the second mounting apparatus 20b has not started mounting of the substrate to at this time point. Therefore, when the change of the assignment of mounting is determined in the state shown in FIG. 8, the controller 11 of the control apparatus 10 may execute processing of changing the number of the mounting apparatus corresponding to the electronic component I1 from 3 to 2 in the formats 2o, 2p, . . . corresponding to the substrate to and the subsequent substrates 1. As described above, for the substrate 1 that is not yet mounted with an electronic component by the mounting apparatus 20 corresponding to the changed number, the controller 11 of the control apparatus 10 may execute processing of changing the number of the mounting apparatus in the format 2 corresponding to that substrate 1.

Figure 10:
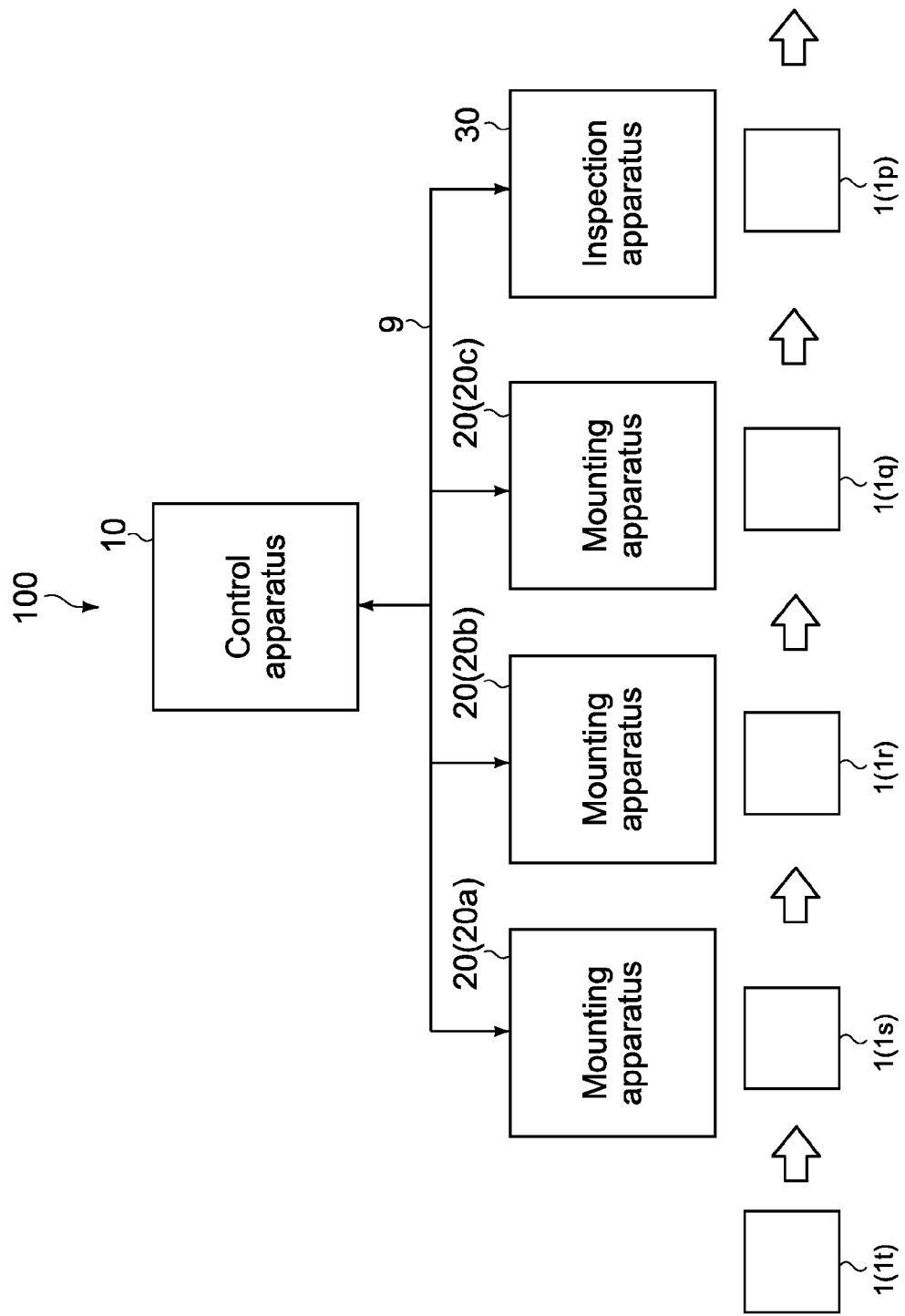
FIG. 10 is a complementary diagram for explaining processing of the mounting system according to the embodiment of the present disclosure and shows substrate positions at a certain time.

FIG. 10 is a diagram showing a state where the substrate 1p is moved to the inspection apparatus 30 and an inspection of the substrate 1p is ended.

FIG. 11 is a diagram showing an example of the format 2 for each substrate 1 at a time point the inspection of the substrate 1p by the inspection apparatus 30 is ended and a deviation amount of an electronic component is written in the format 2p of the substrate 1p. In other words, FIG. 11 is a diagram showing an example of the format 2 at the time point shown in FIG. 10. FIG. 11 shows a case where the electronic component I1 (inductor) assigned to be mounted by the second mounting apparatus 20b is deviated 2 mm in the X direction and 3 mm in the Y direction from its regular position in the format 2p of the substrate 1p.

When an inspection of the substrate 1p by the inspection apparatus 30 is ended and information on a deviation amount of an electronic component is transmitted from the control apparatus 10 to each mounting apparatus 20 (Step 111), the mounting apparatus 20 writes the deviation amount of the electronic component in the format 2 corresponding to the substrate 1p and stores it (Step 112). Then, the mounting apparatus 20 refers to the format 2p of the substrate 1p and judges whether the electronic component that the mounting apparatus itself is assigned to mount is deviated on the substrate 1p and the deviation amount of the electronic component (Step 113).

In this example, in the format 2p of the substrate 1p, the column of the number of the mounting apparatus corresponding to the electronic component I1 is 2. Therefore, in this case, the second mounting apparatus 20b judges that the electronic component I1 that the mounting apparatus itself is assigned to mount is deviated.

Upon judging the deviation amount of the electronic component I1 on the substrate 1p, the second mounting apparatus 20b mounts, after correcting the mounting position of the electronic component I1, the electronic component I1 on the substrate 1s to be mounted next and the subsequent substrates 1 (see FIG. 10) (Step 114). In this case, for correcting the deviation amount of the electronic component I1, the controller 21 of the second mounting apparatus 20b mounts the electronic component I1 at a position that is deviated −2 mm in the X direction and −3 mm in the Y direction.

As described above, in this embodiment, even when the assignment of mounting of an electronic component is changed, information on a deviation amount of an electronic component can be accurately fed back to the mounting apparatus 20 that has mounted the electronic component at a deviated position out of the plurality of mounting apparatuses 20. In other words, in this embodiment, the format 2 including divisional information of the mounting apparatus 20 (information on number of mounting apparatus) and information on a deviation amount of an electronic component is prepared for each substrate 1. When the assignment of mounting of an electronic component by the mounting apparatus 20 is changed, processing of changing, in real time, divisional information of a format 2 corresponding to the substrate 1 for which the assignment has been changed is executed. As a result, since it is possible to follow the change of the assignment of mounting in real time for each substrate 1, information on a deviation amount can be accurately fed back to the mounting apparatus 20 that has mounted the electronic component at the deviated position out of the plurality of mounting apparatuses 20. The mounting apparatus 20 that has mounted the electronic component at the deviated position can correct the positional deviation of the electronic component based on the deviation amount of the electronic component in the format 2.

Second Embodiment

Next, a second embodiment of the present disclosure will be described. It should be noted that in the descriptions on the second embodiment and subsequent embodiments, parts having the same structures and functions as those of the first embodiment described above will be denoted by the same symbols, and descriptions thereof will be omitted or simplified.

[Overall Structure of Mounting System and Structures of Components]

Figure 12:
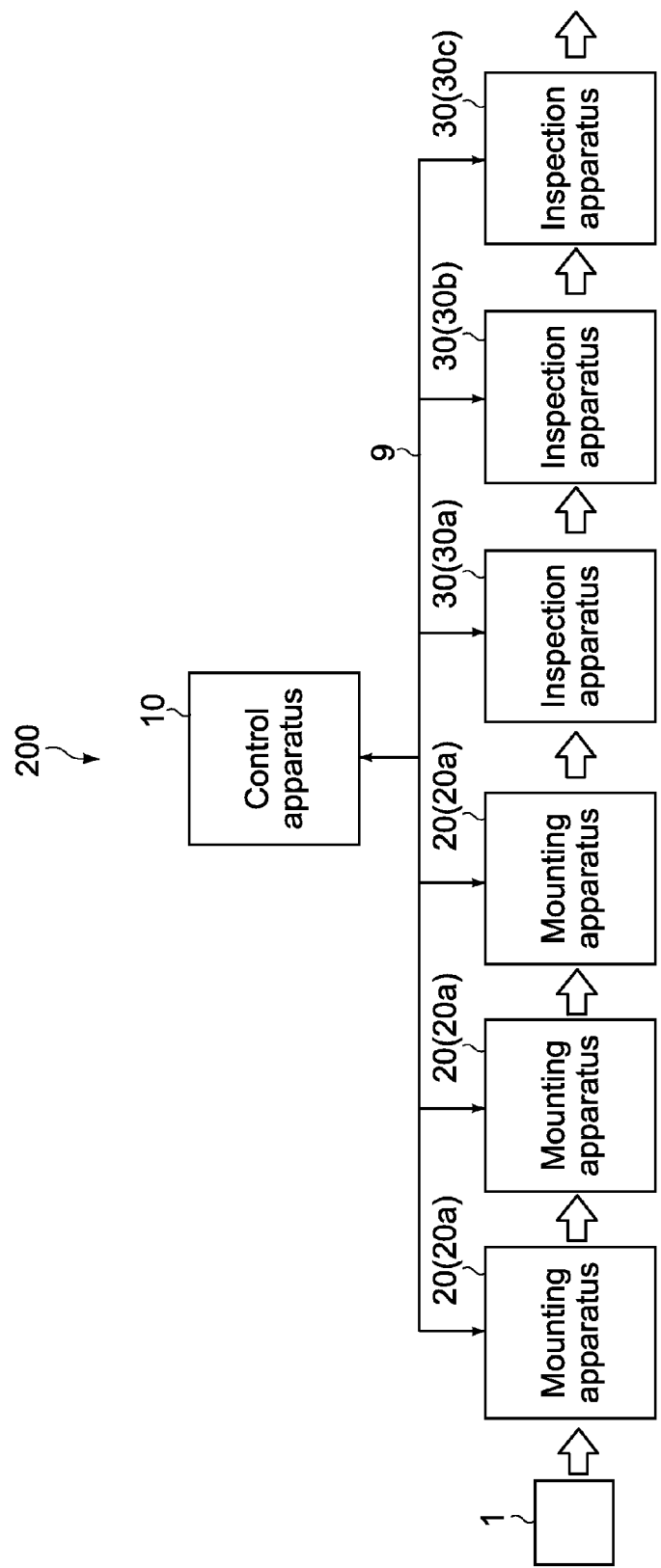
FIG. 12 is a diagram showing a mounting system according to another embodiment of the present disclosure.

FIG. 12 is a diagram showing a mounting system 200 according to the second embodiment. As shown in FIG. 12, the mounting system 200 includes the control apparatus 10, the plurality of mounting apparatuses 20, and a plurality of inspection apparatuses 30. The second embodiment is different from the first embodiment in that the plurality of inspection apparatuses 30 are connected in a line on a downstream side of the plurality of mounting apparatuses 20.

The plurality of inspection apparatuses 30 divisionally inspect the substrate 1 on which electronic components are mounted by the plurality of mounting apparatuses 20. In the example shown in FIG. 12, the number of inspection apparatuses 30 is 3. It should be noted that when distinguishing the 3 inspection apparatuses 30 from one another in particular, the inspection apparatuses 30 are referred to as first inspection apparatus 30a, second inspection apparatus 30b, and third inspection apparatus 30c from an upstream side of the substrate 1.

Upon ending an inspection of an electronic component that the apparatus itself is assigned to inspect, the first inspection apparatus 30a hands over the substrate 1 to the second inspection apparatus 30b, and upon ending an inspection of an electronic component that the apparatus itself is assigned to inspect, the second inspection apparatus 30b hands over the substrate 1 to the third inspection apparatus 30c. Upon ending an inspection of an electronic component that the apparatus itself is assigned to inspect, the third inspection apparatus 30c hands over the substrate 1 to, for example, a reflow apparatus.

FIG. 13 is a diagram showing an example of a format 3 used in the mounting system 200 according to the second embodiment. The format 3 is different from the format 2 of the first embodiment in that a column of a number of an inspection apparatus is added. In other words, the format 3 additionally includes divisional information of an inspection apparatus that indicates which of a plurality of electronic components is inspected by what inspection apparatus 30 out of the plurality of inspection apparatuses 30. The format 3 is commonly used by the control apparatus 10, the plurality of mounting apparatuses 20, and the plurality of inspection apparatuses 30.

[Explanation on Operation]

Figure 14:
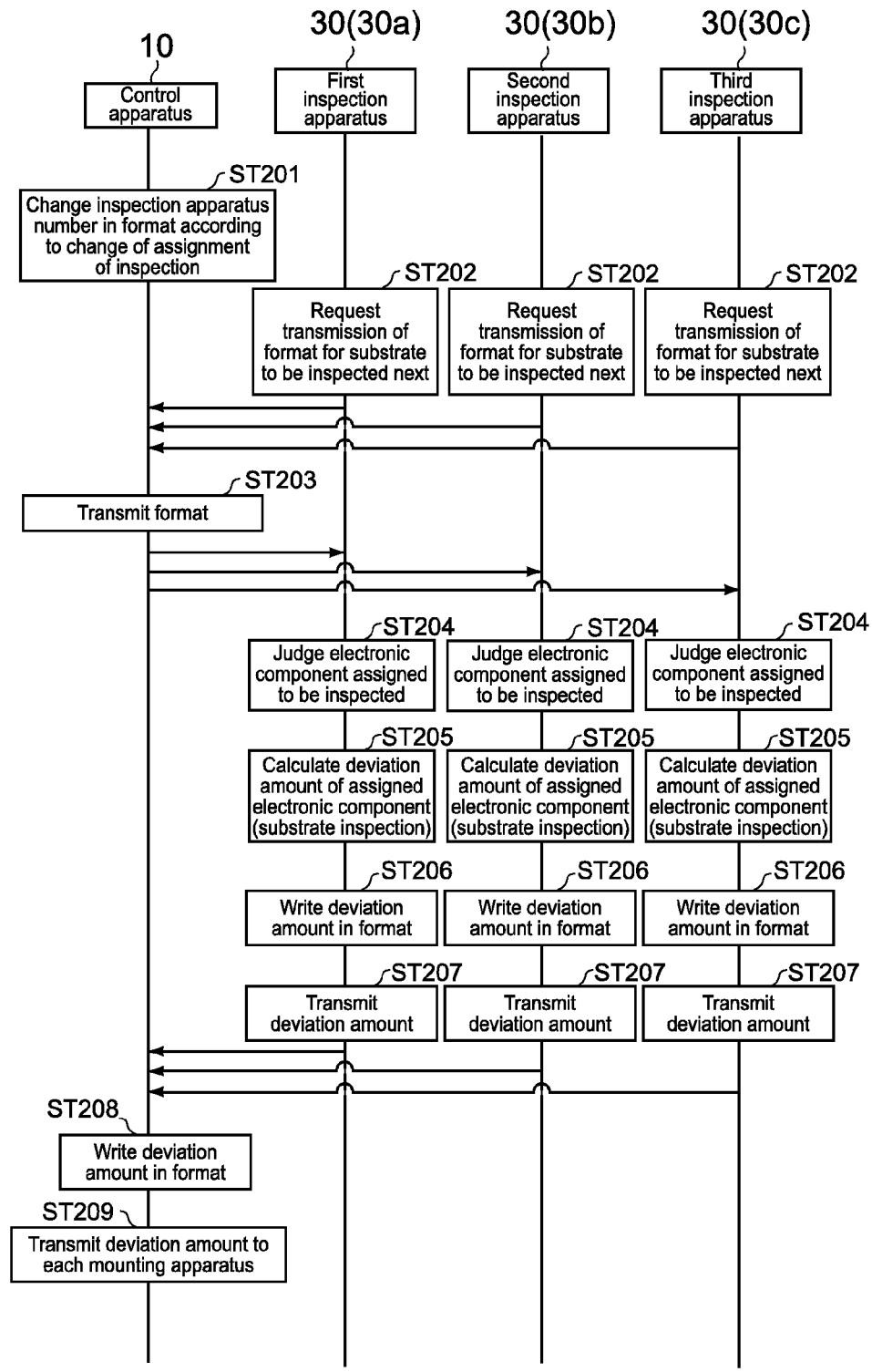
FIG. 14 is a sequence diagram showing processing of the mounting system according to the another embodiment.

An operation of the mounting system 200 according to the second embodiment will be described. FIG. 14 is a sequence diagram showing processing of the mounting system 200 according to the second embodiment. It should be noted that processing carried out among the control apparatus 10 and the 3 mounting apparatuses 20 is basically the same as that of the first embodiment, and thus processing carried out among the control apparatus 10 and the plurality of inspection apparatuses 30 will mainly be described in the second embodiment.

The controller 11 of the control apparatus 10 executes processing of changing in real time, in accordance with a change of an assignment of an inspection of an electronic component by the inspection apparatus 30, the number of the inspection apparatus (divisional information of inspection apparatus) in the format 3 corresponding to the substrate 1 for which the inspection assignment has been changed (Step 201).

For example, when an error such as a positional deviation of an electronic component is detected in any of the 3 inspection apparatuses 30, the inspection apparatus 30 in which the error has occurred needs to execute processing corresponding to the error, such as marking processing. Therefore, the inspection time of the inspection apparatus 30 in which the error has occurred may become longer than that of other inspection apparatuses 30 in which an error has not occurred. In such a case, the electronic components assigned to be inspected by the inspection apparatus 30 in which the error has occurred need to be assigned to the other inspection apparatuses 30 in which an error has not occurred.

Figure 15:
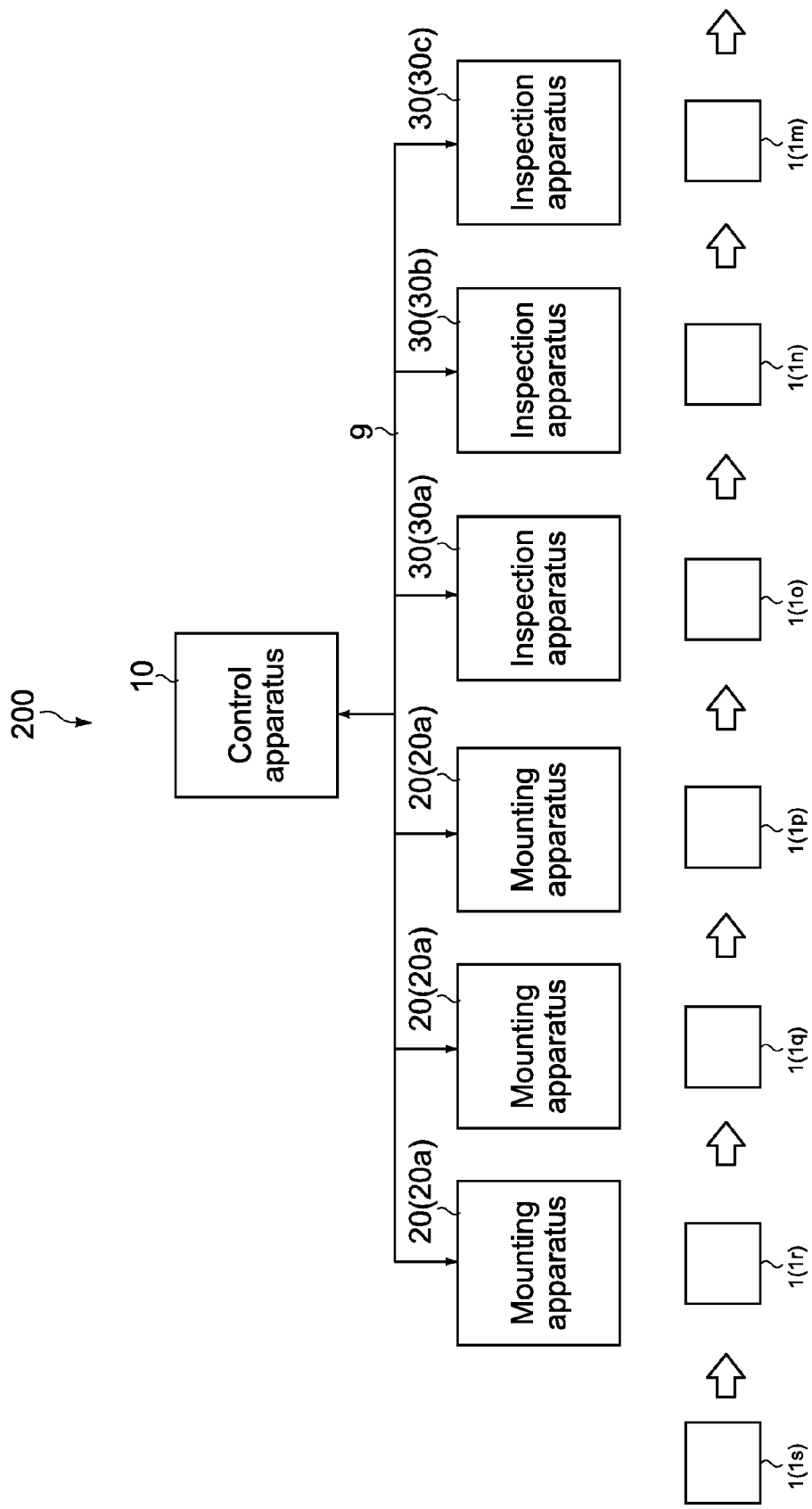
FIG. 15 is a complementary diagram for explaining processing of the mounting system according to the another embodiment and shows substrate positions at a certain time.

FIG. 15 shows a state where inspections of the substrates 1$o$, 1$n$, and 1$m$ by the first inspection apparatus 30$a$, the second inspection apparatus 30$b$, and the third inspection apparatus 30$c$ and mounting of the substrates 1$r$, 1$q$, and 1$p$ by the first mounting apparatus 20$a$, the second mounting apparatus 20$b$, and the third mounting apparatus 20$c$ have ended.

FIG. 16 shows an example of the format 3 for each substrate 1 at the time point shown in FIG. 15.

Here, for example, a case where the controller 11 of the control apparatus 10 determines to change an assignment of an inspection of the electronic component I1 from the third inspection apparatus 30$c$ to the second inspection apparatus 30$b$ for raising a mounting tact will be discussed.

In this case, the controller 11 of the control apparatus 10 executes processing of changing the number of the inspection apparatus corresponding to the electronic component I1 from 3 to 2 in a format 3$p$ of a substrate 1$p$ whose electronic component is not yet inspected (substrate 1$p$ on which electronic component is to be inspected by first inspection apparatus 30$a$) (see FIG. 15) (Step 201). It should be noted that also for the formats 3$q$, 3$r$, . . . corresponding to the substrate 1$q$ and the subsequent substrates 1, the processing of changing the number of the inspection apparatus corresponding to the electronic component I1 from 3 to 2 is executed.

In the descriptions herein, the descriptions have been given on the case where the number of the inspection apparatus corresponding to the electronic component I1 is changed from 3 to 2 in the formats 3$p$, 3$q$, . . . corresponding to the substrate 1$p$ and the subsequent substrates 1 when a change of the inspection assignment is determined in the state shown in FIG. 15. However, the second inspection apparatus 30$b$ has not started the inspection of the substrate to at this time point. Therefore, when the change of the inspection assignment is determined in the state shown in FIG. 15, the controller 11 of the control apparatus 10 may execute processing of changing the number of the inspection apparatus corresponding to the electronic component I1 from 3 to 2 in the formats 3$o$, 3$p$, . . . corresponding to the substrate 1$o$ and the subsequent substrates 1. In other words, for the substrate 1 that is not yet inspected by the inspection apparatus 30 corresponding to the changed number, the controller 11 of the control apparatus 10 may execute processing of changing the number of the inspection apparatus in the format 3 corresponding to that substrate 1.

The controller 31 of each inspection apparatus 30 transmits a signal of a transmission request for a format 3 corresponding to the substrate 1 to be inspected next to the control apparatus 10 via the communication unit 33 (Step 202). In the example shown in FIG. 15, the substrates 1 to be inspected next by the first inspection apparatus 30$a$, the second inspection apparatus 30$b$, and the third inspection apparatus 30$c$ are the substrates 1$p$, 1$o$, and 1$n$. Therefore, in this case, the first inspection apparatus 30$a$, the second inspection apparatus 30$b$, and the third inspection apparatus 30$c$ transmit signals of a transmission request for formats 3$p$, 3$o$, and 3$n$ corresponding to the substrates 1$p$, 1$o$, and 1$n$ to the control apparatus 10.

Upon receiving the signals of the transmission request for the formats 3 from the inspection apparatuses 30, the controller 11 of the control apparatus 10 transmits the requested formats 3 to the inspection apparatuses 30 (Step 203).

Upon receiving the format 3 from the control apparatus 10 via the communication unit 33, the controller 31 of each inspection apparatus 30 stores the received format 3 in the storage 32. Then, the controller 31 of each inspection apparatus 30 judges an electronic component that is assigned to be inspected by the apparatus itself based on the format 3 (Step 204). In the format 3, the component name of the electronic component and the number of the inspection apparatus for the electronic component are associated with each other. Therefore, each inspection apparatus 30 can judge the electronic component assigned to be inspected by the apparatus itself based on the format 3.

For example, the controller 31 of the first inspection apparatus 30$a$ judges that the apparatus itself is assigned to inspect an electronic component whose column of the number of the inspection apparatus is 1 in the format 3$p$ corresponding to the substrate 1$p$. Further, for example, the controllers 31 of the second inspection apparatus 30$b$ and the third inspection apparatus 30$c$ judge that the apparatuses themselves are assigned to inspect electronic components whose columns of the number of the inspection apparatus are 2 and 3 in the formats 3$o$ and 3$n$ corresponding to the substrates 1$o$ and 1$n$.

Then, each inspection apparatus 30 calculates a deviation amount of the electronic component assigned to itself (Step 205) In this case, the controller 31 of each inspection apparatus 30 calculates a deviation amount of the electronic component by comparing the actual position of the electronic component and the regular position of the electronic component (mounting position of electronic component in format 3).

Upon calculating the deviation amount of the electronic component, each inspection apparatus 30 writes the deviation amount of the electronic component in the format 3 corresponding to the inspected substrate 1 (Step 206). For example, the first inspection apparatus 30a, the second inspection apparatus 30b, and the third inspection apparatus 30c write the inspected deviation amount in the formats 3p, 3o, and 3n corresponding to the substrates 1p, 1o, and 1n. Then, the inspection apparatus 30 transmits information on the deviation amount of the electronic component to the control apparatus 10 (Step 207).

Here, in the format 3p corresponding to the substrate 1p, the number of the inspection apparatus for the electronic component I1 is changed from 3 to 2. Therefore, the electronic component I1 is inspected by the second inspection apparatus 30b on the substrate 1p and the subsequent substrates.

As described above, in this embodiment, it is possible to flexibly cope with a change of an inspection assignment of an electronic component by the inspection apparatus 30.

Upon receiving the information on the deviation amount of the electronic component from each inspection apparatus 30, the controller 11 of the control apparatus 10 writes the received deviation amounts in the formats 3 (Step 208). Then, the controller 11 of the control apparatus 10 transmits the information on the deviation amount of the electronic component to each mounting apparatus 20 (Step 209).

Upon receiving the information on the deviation amount of the electronic component from the control apparatus 10, the controller 21 of each mounting apparatus 20 writes the deviation amount in the format 3 and stores it in the storage 22. Then, each mounting apparatus 20 judges whether the electronic component that the apparatus itself is assigned to mount is deviated based on the format 3 and the deviation amount of the electronic component. Upon judging the deviation amount of the electronic component, the controller 21 of each mounting apparatus 20 mounts the electronic component on the substrate 1 to be mounted next after correcting the deviation amount based on the deviation amount of the electronic component.

In the descriptions on the second embodiment, the case where the plurality of inspection apparatuses 30 are arranged on the downstream side of the plurality of mounting apparatuses 20 has been described. On the other hand, the mounting apparatuses 20 and the inspection apparatuses 30 may be arranged alternately like the first mounting apparatus 20a, the first inspection apparatus 30a, the second mounting apparatus 20b, the second inspection apparatus 30b, and so on. In this case, by inspecting the electronic component mounted by the mounting apparatus 20 by the inspection apparatus 30 arranged right after that mounting apparatus 20, a time required for the feedback of the inspection result can be shortened.

Third Embodiment

Figure 17:
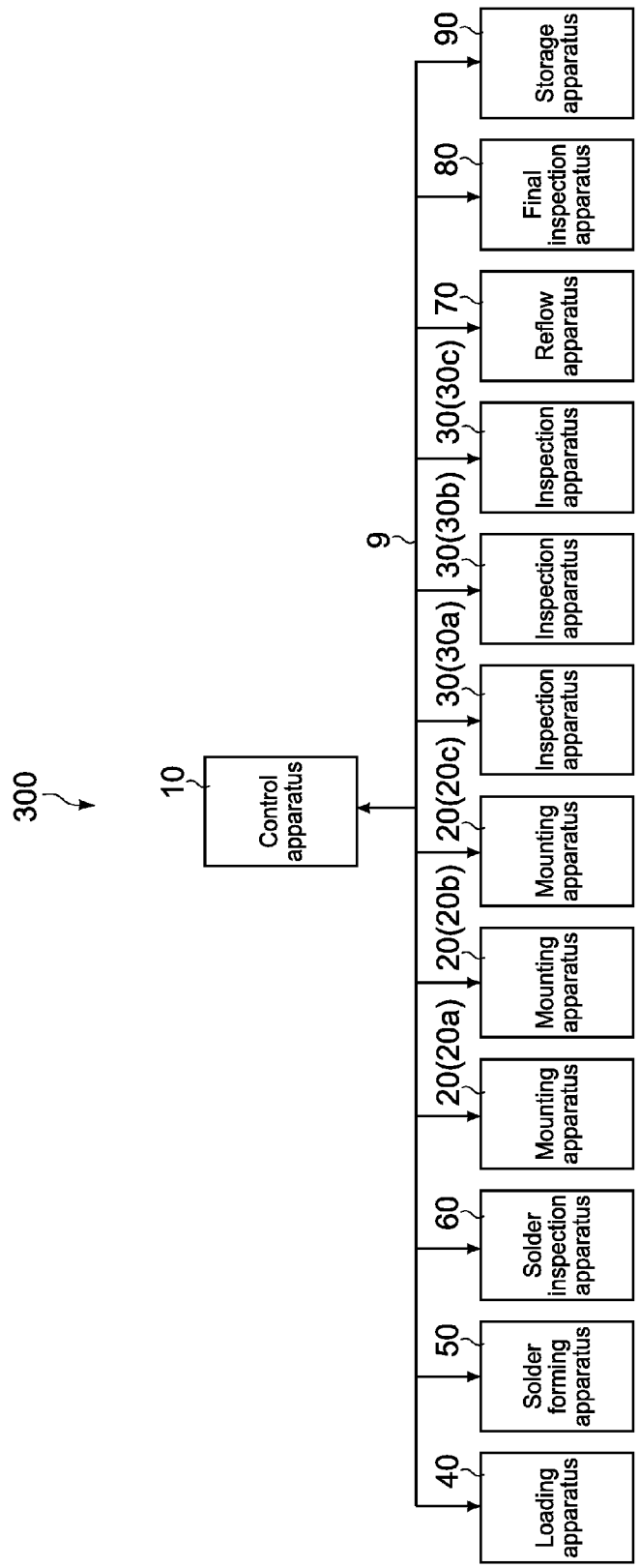
FIG. 17 is a diagram showing a mounting system according to still another embodiment of the present disclosure.

Next, a third embodiment of the present disclosure will be described.
[Overall Structure of Mounting System and Structures of Components]
FIG. 17 is a diagram showing a mounting system 300 according to the third embodiment. As shown in FIG. 17, the mounting system 300 according to the third embodiment includes the control apparatus 10 that controls the apparatuses. The mounting system 300 also includes, from the upstream side of the substrate 1, a loading apparatus 40, a solder forming apparatus 50, a solder inspection apparatus 60, the plurality of mounting apparatuses 20, the plurality of inspection apparatuses 30, a reflow apparatus 70, a final inspection apparatus 80, and a storage apparatus 90.

The loading apparatus 40 loads the substrate 1 into the solder forming apparatus 50. The loading apparatus 40 includes a controller that collectively controls the components of the loading apparatus 40, a storage including a volatile memory and a nonvolatile memory, a communication unit for communicating with other apparatuses, and a loading mechanism that loads the substrate 1 into the solder forming apparatus 50.

The solder forming apparatus 50 forms a solder at a position corresponding to a mounting position of an electronic component and hands over the substrate 1 on which the solder is formed to the solder inspection apparatus 60. Examples of the solder forming apparatus 50 include a solder cream printing apparatus that prints a solder cream on the substrate 1 and a solder application apparatus that discharges a solder cream from a nozzle and applies it.

The solder forming apparatus 50 includes a controller that collectively controls the components of the solder forming apparatus 50, a storage including a volatile memory and a nonvolatile memory, a communication unit for communicating with other apparatuses, and a solder forming mechanism that forms a solder on the substrate 1.

The solder inspection apparatus 60 inspects the substrate 1 on which a solder has been formed by the solder forming apparatus 50 and hands over the substrate 1 to the first mounting apparatus 20a. The solder inspection apparatus 60 includes a controller that collectively controls the components of the solder inspection apparatus 60, a storage including a volatile memory and a nonvolatile memory, a communication unit for communicating with other apparatuses, and a solder inspection mechanism that inspects a solder formed on the substrate 1. The solder inspection mechanism includes an image pickup portion that picks up an image of the substrate 1 on which a solder is formed.

The plurality of mounting apparatuses 20 and the plurality of inspection apparatuses 30 have the same structures as those of the above embodiments, and thus detailed descriptions thereof will be omitted.

The reflow apparatus 70 carries out reflow processing on the substrate 1 that has been handed over from the third inspection apparatus 30c and hands over the substrate 1 that has been subjected to the reflow processing to the final inspection apparatus 80. The reflow apparatus 70 includes a controller that collectively controls the components of the reflow apparatus 70, a storage including a volatile memory and a nonvolatile memory, a communication unit for communicating with other apparatuses, and a heating mechanism that carries out reflow processing on the substrate 1.

The final inspection apparatus 80 carries out a final inspection on the substrate 1 that has been subjected to the reflow processing and hands over the substrate 1 to the storage apparatus 90. The final inspection apparatus 80 basically has the same structure as the inspection apparatuses 30, and thus detailed descriptions thereof will be omitted.

The storage apparatus 90 stores the substrate 1 handed over from the final inspection apparatus 80 in a stocker. The storage apparatus 90 includes a controller that collectively controls the components of the storage apparatus 90, a storage including a volatile memory and a nonvolatile memory, a communication unit for communicating with other apparatuses, and a storage mechanism that stores the substrate 1 in the stocker.

FIG. 18 is a diagram showing an example of a format 4 used in the mounting system 300 according to the third embodiment. The format 4 is prepared for each substrate 1 as in the first and second embodiments.

The format 4 is different from the formats 2 and 3 of the above embodiments in that a column of a solder formed at a position corresponding to an electronic component, a column of a position at which a solder is formed (XY coordinates and tilt θ from reference position), and a column of a deviation amount of each solder (deviation amounts in X, Y, and θ directions) are added. In other words, the format 4 additionally includes information on a deviation amount of a solder that indicates how much a solder formed on the substrate 1 by the solder forming apparatus 50 is deviated from its regular position.

A column of a final deviation of an electronic component (deviation amounts in X, Y, and θ directions) is also added in the format 4. In other words, the format 4 additionally includes information on a deviation amount of an electronic component that indicates how much an electronic component mounted on the substrate 1 that has been subjected to the reflow processing by the reflow apparatus 70 is deviated from its regular position. The format 4 is commonly used by the solder forming apparatus 50, the solder inspection apparatus 60, the plurality of mounting apparatuses 20, the plurality of inspection apparatuses 30, and the final inspection apparatus 80.

[Explanation on Operation]

Figure 19:
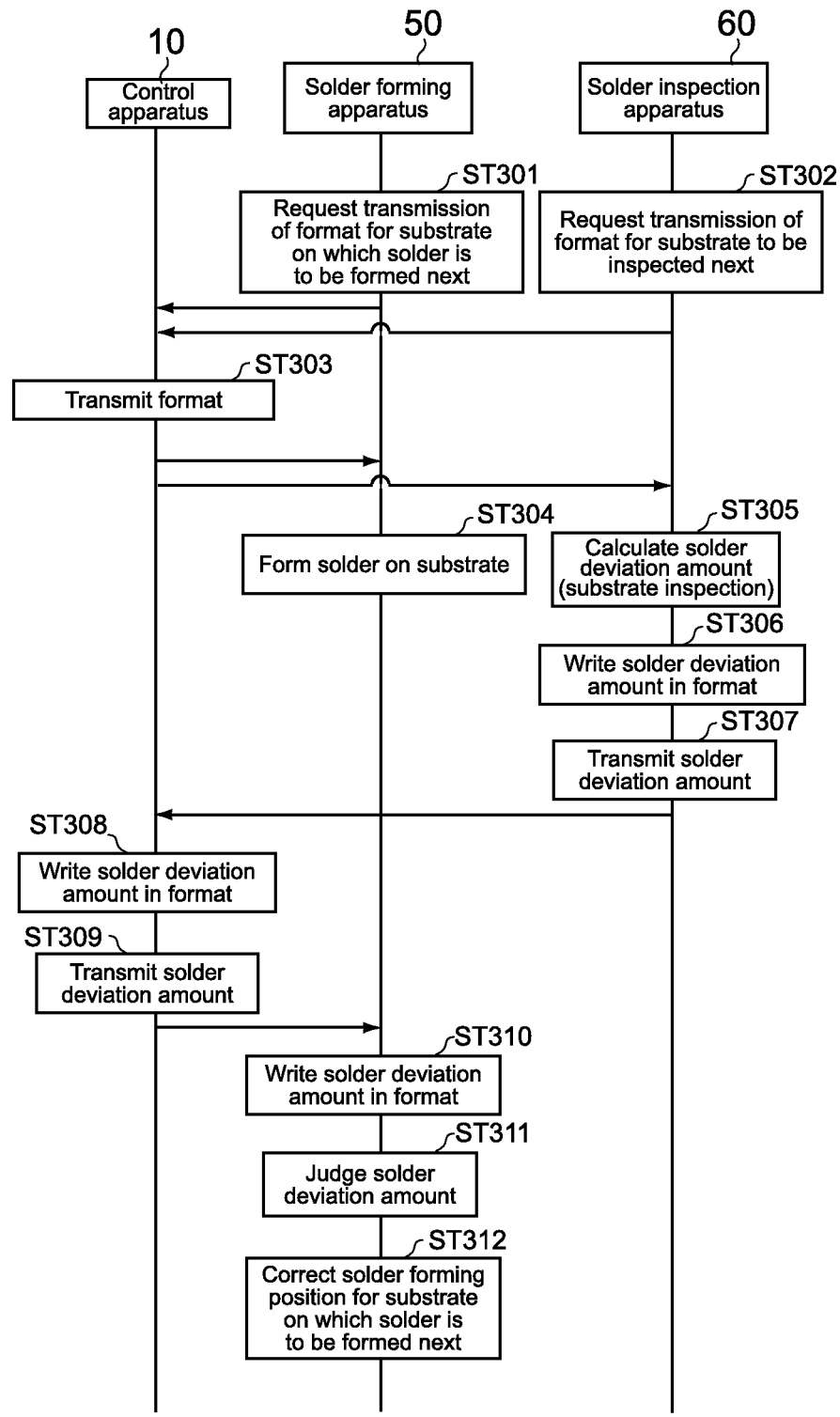
FIG. 19 is a sequence diagram showing operations of a control apparatus, a solder forming apparatus, and a solder inspection apparatus.

An operation of the mounting system 300 according to the third embodiment will be described. First, processing of the control apparatus 10, the solder forming apparatus 50, and the solder inspection apparatus 60 will be described. FIG. 19 is a sequence diagram showing operations of the control apparatus 10, the solder forming apparatus 50, and the solder inspection apparatus 60.

The controller of the solder forming apparatus 50 transmits a signal of a transmission request for a format 4 corresponding to the substrate 1 on which a solder is to be formed next to the control apparatus 10 via the communication unit (Step 301). The controller of the solder inspection apparatus 60 transmits a signal of a transmission request for a format 4 corresponding to the substrate 1 to be inspected next to the control apparatus 10 via the communication unit (Step 302).

Upon receiving the signals of the transmission requests for the formats 4, the controller 11 of the control apparatus 10 transmits the requested formats 4 to the solder forming apparatus 50 and the solder inspection apparatus 60 (Step 303).

Upon receiving the format 4, the solder forming apparatus 50 forms a solder on the substrate 1 (Step 304). Here, when the solder forming apparatus 50 is a solder application apparatus that discharges a solder from a nozzle and applies it, the solder application apparatus may form a solder on the substrate 1 based on information on a solder forming position (XY coordinates and tilt θ from reference position). It should be noted that when the solder forming apparatus 50 is a solder printing apparatus that prints a solder on the substrate 1, information in the format 4 does not need to be used when printing a solder.

Upon receiving the format 4, the solder inspection apparatus 60 inspects the substrate 1 corresponding to the format 4 (Step 305). In this case, the controller of the solder inspection apparatus 60 controls the image pickup portion to pick up an image of the substrate 1 and judges the actual position of the solder by analyzing the image taken by the image pickup portion. Then, the controller of the solder inspection apparatus 60 calculates a deviation amount of the solder by comparing the actual position of the solder and a regular position of the solder (solder forming position in format 4).

Upon calculating the solder deviation amount, the controller of the solder inspection apparatus 60 writes the solder deviation amount in the column of the solder deviation amount in the format 4 and stores it in the storage (Step 306). Then, the controller of the solder inspection apparatus 60 transmits the information on the solder deviation amount to the control apparatus 10 (Step 307).

Upon receiving the information on the solder deviation amount, the controller 11 of the control apparatus 10 writes the solder deviation amount in the column of the solder deviation amount in the format 4 corresponding to the substrate 1 inspected by the solder inspection apparatus 60 and stores it (Step 308). Then, the controller 11 of the control apparatus 10 transmits the information on the solder deviation amount to the solder forming apparatus 50 (Step 309).

Upon receiving the information on the solder deviation amount, the controller of the solder forming apparatus 50 writes the solder deviation amount in the column of the solder deviation amount in the format 4 corresponding to the substrate 1 inspected by the solder inspection apparatus 60 and stores it (Step 310). Next, the controller of the solder forming apparatus 50 judges the solder deviation amount based on the information on the solder deviation amount in the format 4 (Step 311). Then, the solder forming apparatus 50 corrects a solder forming position on the substrate 1 on which a solder is to be formed next based on the solder deviation amount (Step 312). As a result, the solder deviation amount is corrected appropriately.

Next, processing of the control apparatus 10 and the final inspection apparatus 80 will be described.

The controller of the final inspection apparatus 80 transmits a signal of a transmission request for a format 4 corresponding to the substrate 1 to be inspected next to the control apparatus 10. The controller 11 of the control apparatus 10 transmits the requested format 4 to the final inspection apparatus 80.

Upon receiving the format 4 from the control apparatus 10, the controller of the final inspection apparatus 80 stores the format 4 in the storage and calculates a deviation amount of an electronic component based on the format 4. Since the format 4 includes information on a mounting position of an electronic component, the final inspection apparatus 80 can calculate the deviation amount of the electronic component based on the format 4.

Upon calculating the deviation amount of the electronic component, the controller of the final inspection apparatus 80 writes the deviation amount of the electronic component in the column of the final deviation amount in the format 4 corresponding to the inspected substrate 1 and stores it in the storage. Then, the controller of the final inspection apparatus 80 transmits the information on the deviation amount of the electronic component to the control apparatus 10.

Upon receiving the information on the deviation amount from the final inspection apparatus 80, the controller 11 of the control apparatus 10 writes the deviation amount of the electronic component in the column of the final deviation amount in the format 4 corresponding to the substrate 1 for which the deviation amount has been inspected and stores it in the storage 12. Then, the controller 11 of the control apparatus 10 transmits the information on the deviation amount of the electronic component to each mounting apparatus 20. As a result, the deviation amount of the electronic component is fed back to the mounting apparatuses 20.

Upon receiving the information on the deviation amount from the control apparatus 10, the controller 21 of each mounting apparatus 20 writes the deviation amount of the electronic component in the column of the final deviation amount in the format 4 corresponding to the substrate 1 for which the deviation amount has been inspected and stores it in the storage 22. Then, the mounting apparatus 20 judges whether the electronic component that the apparatus itself is assigned to inspect is deviated and the deviation amount of the electronic component based on the format 4. When the electronic component is deviated, the controller 21 of the mounting apparatus 20 mounts the electronic component on the substrate 1 to be mounted next after correcting the deviation amount based on the deviation amount of the electronic component. As a result, the positional deviation of the electronic component is corrected appropriately.

It should be noted that the operations of the control apparatus 10, the plurality of mounting apparatuses 20, and the plurality of inspection apparatuses 30 are basically the same as those of the above embodiments except that the format 4 different from those of the above embodiment is used.

Here, in the third embodiment, when the mounting apparatus 20 mounts an electronic component on the substrate 1, a solder deviation amount is already written in the format 4 corresponding to the substrate 1. Such a solder deviation amount can be used effectively. For example, the controller 21 of each mounting apparatus 20 may mount an electronic component on a solder formed at a position deviated from a regular position based on the solder deviation amount.

Here, a solder is often formed in an area where a solder resist formed on a surface of the substrate 1 opens. Therefore, even when a solder is formed at a position somewhat deviated from a regular position, the solder is often automatically moved to a regular position by a solder resist in the reflow processing by the reflow apparatus 70. Consequently, when an electronic component is mounted on a positionally-deviated solder, the electronic component is automatically moved to its regular position by the movement of the solder.

The case where a single solder inspection apparatus 60 is provided has been described in the third embodiment. However, a plurality of solder inspection apparatuses 60 may be provided. The plurality of solder inspection apparatuses 60 divisionally inspect a plurality of solders. In this case, a column of a number of a solder inspection apparatus is added to the format 4. Further, although the case where a single final inspection apparatus 80 is provided has been described in the third embodiment, a plurality of final inspection apparatuses 80 may be provided. The plurality of final inspection apparatuses 80 divisionally inspect a plurality of electronic components. In this case, a column of a number of a final inspection apparatus is added to the format 4.

The present disclosure may also take the following structures.

(1) A mounting system, including:

a storage configured to store a plurality of formats for each substrate including divisional information of a mounting apparatus that indicates which of a plurality of mounting apparatuses that divisionally mount a plurality of electronic components on a substrate mounts what electronic component on the substrate out of the plurality of electronic components and information on a deviation amount of an electronic component that indicates how much each of the plurality of electronic components that have been mounted on the substrate and inspected by an inspection apparatus that inspects the substrate on which the plurality of electronic components are mounted is deviated from its regular position; and a controller configured to change, according to a change of an assignment of mounting of the electronic component by the mounting apparatus, the divisional information of the mounting apparatus in a format corresponding to the substrate for which the assignment has been changed, and control the mounting apparatus that has mounted the electronic component and has been specified from the plurality of mounting apparatuses based on the divisional information to mount the electronic component on the substrate after correcting a deviation amount based on the information on a deviation amount of an electronic component.

(2) The mounting system according to (1), in which the information on a deviation amount of an electronic component is divisionally inspected by a plurality of inspection apparatuses, in which the plurality of formats further include divisional information of the inspection apparatus that indicates which of the plurality of inspection apparatuses inspects what electronic component out of the plurality of electronic components, and in which the controller changes, according to a change of an assignment of the inspection of the electronic component by the inspection apparatus, the divisional information of the inspection apparatus in a format corresponding to the substrate for which the assignment has been changed.

(3) The mounting system according to (1) or (2), in which the plurality of formats further include information on a solder deviation amount that indicates how much a solder, that has been formed on the substrate by a solder forming apparatus that forms a solder on the substrate at a position where the electronic component is to be mounted and inspected by a solder inspection apparatus that inspects the substrate on which the solder is formed, is deviated from its regular position, and in which the controller controls the solder forming apparatus to correct the solder forming position based on the information on a solder deviation amount in the format.

(4) The mounting system according to (3), in which the controller controls each of the plurality of mounting apparatuses to mount the electronic component on the solder formed at the position deviated from the regular position based on the information on a solder deviation amount.

(5) An electronic component mounting method, including:

changing, regarding a plurality of formats for each substrate including divisional information of a mounting apparatus that indicates which of a plurality of mounting apparatuses that divisionally mount a plurality of electronic components on a substrate mounts what electronic component on the substrate out of the plurality of electronic components and information on a deviation amount of an electronic component that indicates how much each of the plurality of electronic components that have been mounted on the substrate and inspected by an inspection apparatus that inspects the substrate on which the plurality of electronic components are mounted is deviated from its regular position, according to a change of an assignment of mounting of the electronic component by the mounting apparatus, the divisional information of the mounting apparatus in a format corresponding to the substrate for which the assignment has been changed; and controlling the mounting apparatus that has mounted the electronic component and has been specified from the plurality of mounting apparatuses based on the divisional information to mount the electronic component on the substrate after correcting a deviation amount based on the information on a deviation amount of an electronic component.

(6) A substrate production method, including:

changing, regarding a plurality of formats for each substrate including divisional information of a mounting apparatus that indicates which of a plurality of mounting apparatuses that divisionally mount a plurality of electronic components on a substrate mounts what electronic component on the substrate out of the plurality of electronic components and information on a deviation amount of an electronic component that indicates how much each of the plurality of electronic components that have been mounted on the substrate and inspected by an inspection apparatus that inspects the substrate on which the plurality of electronic components are mounted is deviated from its regular position, according to a change of an assignment of mounting of the electronic component by the mounting apparatus, the divisional information of the mounting apparatus in a format corresponding to the substrate for which the assignment has been changed; and controlling the mounting apparatus that has mounted the electronic component and has been specified from the plurality of mounting apparatuses based on the divisional information to mount the electronic component on the substrate after correcting a deviation amount based on the information on a deviation amount of an electronic component.

(7) A program that causes a computer to execute the steps of:

changing, regarding a plurality of formats for each substrate including divisional information of a mounting apparatus that indicates which of a plurality of mounting apparatuses that divisionally mount a plurality of electronic components on a substrate mounts what electronic component on the substrate out of the plurality of electronic components and information on a deviation amount of an electronic component that indicates how much each of the plurality of electronic components that have been mounted on the substrate and inspected by an inspection apparatus that inspects the substrate on which the plurality of electronic components are mounted is deviated from its regular position, according to a change of an assignment of mounting of the electronic component by the mounting apparatus, the divisional information of the mounting apparatus in a format corresponding to the substrate for which the assignment has been changed; and controlling the mounting apparatus that has mounted the electronic component and has been specified from the plurality of mounting apparatuses based on the divisional information to mount the electronic component on the substrate after correcting a deviation amount based on the information on a deviation amount of an electronic component.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A mounting system, comprising:
a plurality of mounting apparatuses configured to divisionally mount a plurality of electronic components onto a plurality of substrates;
an inspection apparatus that inspects the electronic components and substrates and generates deviation information of the electronic component;
a memory storing
a plurality of formats for each substrate including divisional information of each of the mounting apparatuses that indicates which of the plurality of mounting apparatuses mounts what electronic component on the substrate out of the plurality of electronic components,
the deviation information that includes deviation amounts of one or more of the electronic components indicating how much each of the respective plurality of electronic components that have been mounted on each of the respective substrates are deviated from their regular positions, and
executable instructions for changing mounting assignments of particular electronic components to particular mounting apparatuses and for executing mounting of the electronic components by the mounting apparatuses; and
a controller that executes the instructions stored on the memory to cause
to change an assignment of mounting of a first type of electronic component on the substrates from a first one of the mounting apparatuses to a second one of the mounting apparatuses,
to change, according to the change of assignment, the divisional information of the mounting apparatuses in a format corresponding to the substrates for which the assignment has been changed, and
the second one of the mounting apparatuses, that has been specified from the plurality of mounting apparatuses based on the divisional information, to mount another electronic component on one of the substrates after correcting the deviation amounts.

2. The mounting system according to claim 1, wherein the information on a deviation amount of an electronic component is divisionally inspected by a plurality of inspection apparatuses,
wherein the plurality of formats further include divisional information of the inspection apparatus that indicates which of the plurality of inspection apparatuses inspects what electronic component out of the plurality of electronic components, and
wherein the controller changes, according to a change of an assignment of the inspection of the electronic component by the inspection apparatus, the divisional information of the inspection apparatus in a format corresponding to the substrate for which the assignment has been changed.

3. The mounting system according to claim 1, wherein the plurality of formats further include information on a solder deviation amount that indicates how much a solder, that has been formed on the substrate by a solder forming apparatus that forms a solder on the substrate at a position where the electronic component is to be mounted and inspected by a solder inspection apparatus that inspects the substrate on which the solder is formed, is deviated from its regular position, and
wherein the controller controls the solder forming apparatus to correct the solder forming position based on the information on a solder deviation amount in the format.

4. The mounting system according to claim 3, wherein the controller controls each of the plurality of mounting apparatuses to mount the electronic component on the solder formed at the position deviated from the regular position based on the information on a solder deviation amount.

* * * * *